US012249513B2

(12) United States Patent
Yoshino et al.

(10) Patent No.: US 12,249,513 B2
(45) Date of Patent: Mar. 11, 2025

(54) SURFACE TREATMENT METHOD, METHOD FOR PRODUCING SEMICONDUCTOR SUBSTRATE INCLUDING THE SURFACE TREATMENT METHOD, COMPOSITION FOR SURFACE TREATMENT, AND SYSTEM FOR PRODUCING SEMICONDUCTOR SUBSTRATE INCLUDING THE COMPOSITION FOR SURFACE TREATMENT

(71) Applicant: Fujimi Incorporated, Kiyosu (JP)

(72) Inventors: Tsutomu Yoshino, Kiyosu (JP); Yasuto Ishida, Kiyosu (JP)

(73) Assignee: FUJIMI INCORPORATED (JP)

( * ) Notice: Subject to any disclaimer, the term of this patent is extended or adjusted under 35 U.S.C. 154(b) by 342 days.

(21) Appl. No.: 17/881,283

(22) Filed: Aug. 4, 2022

(65) Prior Publication Data

US 2023/0053210 A1 Feb. 16, 2023

(30) Foreign Application Priority Data

Aug. 5, 2021 (JP) ................. 2021-129176
May 11, 2022 (JP) ................. 2022-078426

(51) Int. Cl.
*H01L 21/306* (2006.01)
*H01L 21/02* (2006.01)
(52) U.S. Cl.
CPC .... *H01L 21/30625* (2013.01); *H01L 21/0217* (2013.01)

(58) Field of Classification Search
CPC ................. H01L 21/30625; H01L 21/0217
See application file for complete search history.

(56) References Cited

U.S. PATENT DOCUMENTS

| 2013/0174867 | A1 | 7/2013 | Harada et al. |
| 2022/0089908 | A1* | 3/2022 | Reiss ................... C09K 3/1436 |
| 2023/0048722 | A1* | 2/2023 | Yoshino ............ H01L 21/31053 |

FOREIGN PATENT DOCUMENTS

JP 2012-074678 A 4/2012

* cited by examiner

*Primary Examiner* — Sharidan Carrillo
(74) *Attorney, Agent, or Firm* — FOLEY & LARDNER LLP

(57) ABSTRACT

The present invention provides a means capable of sufficiently removing a residue containing inorganic oxide abrasive grains present on the surface of a polished object to be polished containing silicon nitride. One aspect of the present invention relates to a surface treatment method for reducing a residue containing inorganic oxide abrasive grains on a surface of a polished object to be polished containing silicon nitride using a composition for surface treatment, wherein the composition for surface treatment contains a zeta potential adjusting agent having a negatively charged functional group and having a viscosity of an aqueous solution having a concentration of 20% by mass at 25° C. of 10 mPa·s or more and a dispersing medium, and the surface treatment method includes controlling a zeta potential of the silicon nitride and a zeta potential of the inorganic oxide abrasive grains each to −30 mV or less using the composition for surface treatment.

8 Claims, No Drawings

SURFACE TREATMENT METHOD, METHOD FOR PRODUCING SEMICONDUCTOR SUBSTRATE INCLUDING THE SURFACE TREATMENT METHOD, COMPOSITION FOR SURFACE TREATMENT, AND SYSTEM FOR PRODUCING SEMICONDUCTOR SUBSTRATE INCLUDING THE COMPOSITION FOR SURFACE TREATMENT

CROSS-REFERENCE TO RELATED APPLICATION

This application is based on Japanese Patent Application No. 2021-129176 filed on Aug. 5, 2021, and Japanese Patent Application No. 2022-078426 filed on May 11, 2022, the contents of which are incorporated herein by reference.

TECHNICAL FIELD

The present invention relates to a surface treatment method, a method for producing a semiconductor substrate including the surface treatment method, a composition for surface treatment, and a system for producing a semiconductor substrate including the composition for surface treatment.

BACKGROUND ART

In recent years, with adoption of multi-layer wiring on the surface of a semiconductor substrate, when producing a device, the so-called Chemical Mechanical Polishing (CMP) technique, in which a semiconductor substrate is polished and flattened, has been used. CMP is a method for flattening the surface of an object to be polished (material to be polished) such as a semiconductor substrate using a polishing composition (slurry) that contains abrasive grains selected from silica, alumina, ceria, and the like and an additive selected from an anticorrosive, a surfactant, and the like. Examples of the object to be polished (material to be polished) include a film made of silicon, polysilicon, silicon oxide, silicon nitride, or the like, a substrate made of the same, a wiring made of a metal or the like, and a member such as a plug.

A large amount of an impurity (also referred to as a foreign substance or a residue) remains on the surface of the semiconductor substrate after the CMP step. Examples of the impurity include abrasive grains derived from the polishing composition used in CMP, an organic substance such as a surfactant, and an anticorrosive derived from the polishing composition used in CMP, a silicon-containing material generated by polishing the silicon-containing material that is an object to be polished, a metal generated by polishing a metal wiring, a plug, or the like that is an object to be polished, and further an organic substance such as a pad debris generated from various pads or the like.

If the surface of the semiconductor substrate is contaminated with these impurities, the electrical properties of the semiconductor may be adversely affected to reduce the reliability of the device. Therefore, it is desirable to introduce a surface treatment step after the CMP step to remove these impurities from the surface of the semiconductor substrate.

As a composition used in a cleaning step which is such a surface treatment step, Japanese Patent Laid-Open No. 2012-74678 (corresponding to US Patent Application Publication No. 2013/0174867) discloses a substrate cleaning liquid for a semiconductor device containing a polycarboxylic acid or a hydroxycarboxylic acid, a sulfonic acid type anionic surfactant, a carboxylic acid type anionic surfactant, and water. It is disclosed that the cleaning liquid can remove impurities without corroding the surface of the substrate.

SUMMARY OF INVENTION

However, a problem of the technique according to Japanese Patent Laid-Open No. 2012-74678 (corresponding to US Patent Application Publication No. 2013/0174867) is that a residue cannot be sufficiently removed when cleaning a polished object to be polished.

Here, the present inventors have studied the relationship between the type of the polished object to be polished and the type of the residue. As a result, the present inventors have found that to the surface of a polished object to be polished containing silicon nitride, which is particularly preferably used as a semiconductor substrate, the inorganic oxide abrasive grains contained in the polishing composition used for polishing the object to be polished easily adhere as a residue. Such a residue containing inorganic oxide abrasive grains can cause deterioration in the performance of a semiconductor device.

The present invention has been made in view of the above problem, and an object thereof is to provide a means capable of sufficiently removing a residue containing inorganic oxide abrasive grains present on the surface of a polished object to be polished containing silicon nitride.

In view of the above problem, the present inventors have made diligent studies. As a result, the present inventors have found that the zeta potential of silicon nitride and the zeta potential of inorganic oxide abrasive grains can each be controlled below a specific value using a composition for surface treatment containing a compound having a specific functional group and an aqueous solution viscosity equal to or more than a specific value and a dispersing medium, and that at this time, the effect of removing a residue containing inorganic oxide abrasive grains on the surface of the polished object to be polished containing silicon nitride is improved, and the present inventors have completed the present invention.

One aspect for solving the above problem to be solved by the present invention relates to a surface treatment method for reducing a residue containing inorganic oxide abrasive grains on a surface of a polished object to be polished containing silicon nitride using a composition for surface treatment, wherein the composition for surface treatment contains a zeta potential adjusting agent having a negatively charged functional group and having a viscosity of an aqueous solution having a concentration of 20% by mass at 25° C. of 10 mPa·s or more and a dispersing medium, and the surface treatment method includes controlling a zeta potential of the silicon nitride and a zeta potential of the inorganic oxide abrasive grains each to −30 mV or less using the composition for surface treatment.

Another aspect for solving the above problem to be solved by the present invention relates to a composition for surface treatment used for reducing a residue containing inorganic oxide abrasive grains on a surface of a polished object to be polished containing silicon nitride, the composition for surface treatment containing a zeta potential adjusting agent having a negatively charged functional group and having a viscosity of an aqueous solution having a concentration of 20% by mass at 25° C. of 10 mPa·s or more and a dispersing medium, and having a function of controlling a zeta potential of the silicon nitride and a zeta potential of the inorganic oxide abrasive grains each to −30 mV or less.

DESCRIPTION OF EMBODIMENTS

Hereinafter, embodiments of the present invention will be described, but the present invention is not limited only to the following embodiments. Herein, unless otherwise specified, operations and measurements of physical properties or the like are carried out under conditions of room temperature (20° C. or more and 25° C. or less)/a relative humidity of 40% RH or more and 50% RH or less. In addition, as used herein, the "inorganic oxide abrasive grains" contained in the polishing composition may be simply referred to as "abrasive grains." Further, an object to be polished after polishing (an object to be polished after polished in a polishing step) is also simply referred to as a "polished object to be polished."

<Surface Treatment Method and Composition for Surface Treatment>

One aspect of the present invention relates to a surface treatment method for reducing a residue containing inorganic oxide abrasive grains on a surface of a polished object to be polished containing silicon nitride using a composition for surface treatment, wherein the composition for surface treatment contains a zeta potential adjusting agent having a negatively charged functional group and having a viscosity of an aqueous solution having a concentration of 20% by mass at 25° C. of 10 mPa·s or more and a dispersing medium, and the surface treatment method includes controlling a zeta potential of the silicon nitride and a zeta potential of the inorganic oxide abrasive grains each to −30 mV or less using the composition for surface treatment.

The method including controlling a zeta potential of the silicon nitride and a zeta potential of the inorganic oxide abrasive grains to −30 mV or less using the composition for surface treatment is not particularly limited, and is preferably a method including contacting a composition for surface treatment containing a zeta potential adjusting agent having a negatively charged functional group and having a viscosity of an aqueous solution having a concentration of 20% by mass at 25° C. of 10 mPa·s or more and a dispersing medium with a surface of a polished object to be polished containing silicon nitride.

From the above, it can also be deemed that another aspect of the present invention is a composition for surface treatment used for reducing a residue containing inorganic oxide abrasive grains on a surface of a polished object to be polished containing silicon nitride, the composition for surface treatment containing a zeta potential adjusting agent having a negatively charged functional group and having a viscosity of an aqueous solution having a concentration of 20% by mass at 25° C. of 10 mPa·s or more and a dispersing medium, and having a function of controlling a zeta potential of the silicon nitride and a zeta potential of the inorganic oxide abrasive grains each to −30 mV or less.

According to the present invention, a means capable of sufficiently removing a residue containing inorganic oxide abrasive grains present on the surface of a polished object to be polished containing silicon nitride is provided.

The above surface treatment method is characterized by the relationship between a composition for surface treatment and a polished object to be polished, which is to be subjected to surface treatment (that is, an object to be surface-treated) using the composition for surface treatment. Specifically, the above surface treatment method results from the finding that the relationship among a composition for surface treatment, a component contained in a polished object to be polished, and a component contained in a polishing composition with which the polished object to be polished is polished (more specifically, a component of the polishing composition adhering to the surface of the polished object to be polished as a residue: abrasive grains) affects the reduction of the residue on the surface of the polished object to be polished. This is because, as will be described later, the above surface treatment method considers that the effect of the present invention is exhibited based on the charge (zeta potential) on the surface of the polished object to be polished and the component (abrasive grains) of the polishing composition present as a residue on the surface of the polished object to be polished.

Some components of the polishing composition easily adhere to the surface of the polished object to be polished and these remain on the surface of the polished object to be polished after the polishing treatment. In particular, the inorganic oxide abrasive grains contained in the polishing composition tend to remain on the surface of the polished object to be polished. In this case, the inorganic oxide abrasive grains remaining on the surface of the polished object to be polished may cause a residue. The above surface treatment method and the above composition for surface treatment can remove such a residue (that is, inorganic oxide abrasive grains) derived from the polishing composition remaining on the surface of the polished object to be polished.

The present inventors presume the mechanism by which the above problem is solved, as follows.

The zeta potential adjusting agent contained in the composition for surface treatment has a negatively charged functional group and has a viscosity of an aqueous solution having a concentration of 20% by mass at 25° C. of 10 mPa·s or more. The zeta potential adjusting agent contained in the composition for surface treatment has a negatively charged functional group. The zeta potential adjusting agent electrostatically adheres to the surface of the residue (residue containing inorganic oxide abrasive grains) present on the surface of the polished object to be polished and the surface of the polished object to be polished containing silicon nitride to negatively charge these surfaces. Then, an electrical repulsion occurs between the residue whose surface is negatively charged and the negatively charged surface of the polished object to be polished containing silicon nitride. As a result, the negatively charged residue is removed from the negatively charged surface of the polished object to be polished containing silicon nitride. In addition, the negatively charged residue is less likely to adhere again to the negatively charged surface of the polished object to be polished containing silicon nitride. In addition, the zeta potential adjusting agent contained in the composition for surface treatment has a viscosity of an aqueous solution having a concentration of 20% by mass at 25° C. of 10 mPa·s or more. In this range, when the zeta potential adjusting agent electrostatically adheres to the surface of the residue (residue containing inorganic oxide abrasive grains) present on the surface of the polished object to be polished and the surface of the polished object to be polished containing silicon nitride, the action as a protective film of the zeta potential adjusting agent further improves. Because of this, the maintenance time of the negative charge on the surface of the residue and the surface of the polished object to be polished containing silicon nitride becomes longer to make the removal of the residue easier. In addition, hydrophilization of the surface of the residue and the surface of the polished object to be polished containing silicon nitride is further promoted and the residue is easily dispersed in the composition for surface treatment to make the removal of the residue easier. As described above, the chemical interaction between each component contained in the composition for surface treatment and both the surface of the polished object to be polished and the residue on the surface of the polished object to be polished makes the removal of the residue on the surface of the polished object to be polished easier to better remove the residue on the surface of the polished object to be polished.

The above mechanism is based on speculation, and whether the mechanism is correct or incorrect does not affect the technical scope of the present invention.

[Residue]

As used herein, the residue refers to a foreign substance adhering to the surface of a polished object to be polished. The residue is not particularly limited, and examples thereof include a particulate abrasive grain residue derived from abrasive grains contained in the polishing composition, organic residues described later, and another foreign substance.

As used herein, the organic residues are not particularly limited, and refer to a component consisting of an organic substance such as an organic low molecular weight compound, a polymer compound, an organic salt, or the like among the foreign substances adhering to the surface of the polished object to be polished. The organic residues adhering to the polished object to be polished are not particularly limited, and examples thereof include a pad debris (for example, polyurethane) generated from the pad used in the polishing treatment or the surface treatment described later, a component derived from an additive contained in the polishing composition used in the polishing treatment, and a component derived from an additive contained in the composition for surface treatment used in the surface treatment.

The total number of residues refers to the total number of all residues regardless of the types thereof. The total number of residues can be measured using a wafer defect inspection apparatus (for example, optical inspection machine Surfscan (registered trademark) SP5, manufactured by KLA-Tencor Corporation). Details of the method for measuring the total number of residues will be described in Examples described later.

An abrasive grain residue, organic residues (for example, a polyurethane residue), and another foreign substance are greatly different in color, shape, and the like from one another, and thus it can be determined by SEM observation whether a foreign substance is an abrasive grain residue, organic residues (for example, a polyurethane residue), or another foreign substance. A polyurethane residue and other organic residues are greatly different in color, shape, and the like from each other, and thus it can be determined by SEM observation whether organic residues are a polyurethane residue or other organic residues. In addition, it may each be determined by elemental analysis using an energy dispersive X-ray analyzer (EDX) as necessary whether a foreign substance is an abrasive grain residue, organic residues, or another foreign substance, what the type of the abrasive grain residue is, and what the type of the organic residues is. Details of the methods for measuring the number of abrasive grain residues and the number of polyurethane residues will be described in Examples described later.

In the surface treatment method according to the above aspect, the zeta potential of a residue on the surface of a polished object to be polished can be controlled using a composition for surface treatment. Specifically, the zeta potential of the inorganic oxide abrasive grains contained in the residue is controlled to −30 mV or less. The composition for surface treatment according to the above aspect has the function of controlling the zeta potential of a residue on the surface of a polished object to be polished. Specifically, the composition for surface treatment according to the above aspect has the function of controlling the zeta potential of the inorganic oxide abrasive grains contained in the residue to −30 mV or less. As used herein, the inorganic oxide abrasive grains mean inorganic oxide used as abrasive grains in a polishing composition. Therefore, when the residue contains inorganic oxide abrasive grains, the inorganic oxide abrasive grains become an abrasive grain residue. Preferable examples of the inorganic oxide abrasive grains contained in the residue are not particularly limited and include cerium oxide abrasive grains and anion-modified silicon oxide abrasive grains, which are preferable abrasive grains in the description of the polishing composition described later. According to the surface treatment method according to one preferable embodiment of the present invention, the inorganic oxide abrasive grains contain at least one selected from the group consisting of cerium oxide abrasive grains and anion-modified silicon oxide abrasive grains, and the zeta potential of at least one selected from the group consisting of cerium oxide abrasive grains and anion-modified silicon oxide abrasive grains is controlled to −30 mV or less using a composition for surface treatment. According to the surface treatment method according to one more preferable embodiment of the present invention, the inorganic oxide abrasive grains contain cerium oxide abrasive grains, and the zeta potential of the cerium oxide abrasive grains is controlled to −30 mV or less using a composition for surface treatment. For the composition for surface treatment according to one preferable embodiment of the present invention, in an application thereof, the inorganic oxide abrasive grains contain at least one selected from the group consisting of cerium oxide abrasive grains and anion-modified silicon oxide abrasive grains, and the composition for surface treatment has the function of controlling the zeta potential of at least one selected from the group consisting of cerium oxide abrasive grains and anion-modified silicon oxide abrasive grains to −30 mV or less. For the composition for surface treatment according to one more preferable embodiment of the present invention, in an application thereof, the inorganic oxide abrasive grains contain cerium oxide abrasive grains, and the composition for surface treatment has the function of controlling the zeta potential of the cerium oxide abrasive grains to −30 mV or less.

When the residue contains polyurethane, the zeta potential of the polyurethane contained in the residue is preferably controlled to −10 mV or less. In the surface treatment method according to one preferable embodiment of the present invention, the residue further contains polyurethane, and the surface treatment method further includes controlling the zeta potential of the polyurethane to −10 mV or less using a composition for surface treatment. For the composition for surface treatment according to one preferable embodiment of the present invention, in an application thereof, the residue further contains polyurethane, and the composition for surface treatment further has the function of controlling the zeta potential of the polyurethane to −10 mV or less.

The zeta potential of the inorganic oxide abrasive grains (preferably at least one selected from the group consisting of cerium oxide abrasive grains and anion-modified silicon oxide abrasive grains and more preferably cerium oxide abrasive grains) contained in the residue is preferably −65 mV or more, more preferably −60 mV or more, further preferably −55 mV or more, and particularly preferably −50 mV or more. The zeta potential of the inorganic oxide abrasive grains (preferably at least one selected from the group consisting of cerium oxide abrasive grains and anion-modified silicon oxide abrasive grains and more preferably cerium oxide abrasive grains) contained in the residue is preferably −31 mV or less, more preferably −33 mV or less, further preferably −35 mV or less, particularly preferably −37 mV or less, and most preferably −39 mV or less. By controlling the zeta potential of the inorganic oxide abrasive grains to a value within the above ranges, the effect of removing the residue containing the inorganic oxide abrasive grains present on the surface of the polished object to be polished containing silicon nitride is further exerted. By causing the composition for surface treatment to have the function of controlling the zeta potential of the inorganic oxide abrasive grains to a value within the above ranges, the effect of removing the residue containing the inorganic oxide abrasive grains present on the surface of the polished object to be polished containing silicon nitride is further exerted.

The zeta potential of the polyurethane contained in the residue is preferably −65 mV or more, more preferably −55 mV or more, further preferably −50 mV or more, and particularly preferably −45 mV or more. The zeta potential of the polyurethane contained in the residue is preferably −30 mV or less, more preferably −35 mV or less, further preferably −40 mV or less, and particularly preferably −43 mV or less. By controlling the zeta potential of the polyurethane to a value within the above ranges, the effect of removing the residue containing the polyurethane present on the surface of the polished object to be polished containing silicon nitride is further exerted. By causing the composition for surface treatment to have the function of controlling the zeta potential of the polyurethane to a value within the above ranges, the effect of removing the residue containing the polyurethane present on the surface of the polished object to be polished containing silicon nitride is further exerted.

The zeta potential of the inorganic oxide abrasive grains contained in the residue can be measured by Zetasizer Nano ZSP manufactured by Spectris Co., Ltd. (Malvern Division). The zeta potential of the polyurethane contained in the residue can be measured using a solid zeta potential measuring instrument SurPASS 3 manufactured by Anton Paar Japan K. K. Details of the measurement method will be described in Examples.

The zeta potentials of the inorganic oxide abrasive grains and the polyurethane contained in the residue can each be controlled, for example, by the type and amount of the zeta potential adjusting agent, the pH of the composition for surface treatment, or the like. By increasing the negative charge of the zeta potential adjusting agent in the state of being present in the composition for surface treatment, the zeta potentials of the inorganic oxide abrasive grains and polyurethane can each be lowered. For example, by selecting a compound having an anionic group as the zeta potential adjusting agent, selecting an acid (salt) group as the anionic group, or above all, selecting a specific acid (salt) group as described later, the zeta potentials of the inorganic oxide abrasive grains and the polyurethane can each be further lowered. By appropriately lowering the pH to a range not too low, the zeta potentials of the inorganic oxide abrasive grains and the polyurethane can each be further lowered. By increasing the amount of the zeta potential adjusting agent in the composition for surface treatment, the zeta potential lowering action of the zeta potential adjusting agent can be further enhanced.

[Polished Object to be Polished]

As used herein, the polished object to be polished means an object to be polished after polished in a polishing step. The polishing step is not particularly limited, and is preferably a CMP step.

The composition for surface treatment used in the surface treatment method according to the above aspect and the composition for surface treatment according to the above aspect are each used for reducing a residue remaining on the surface of a polished object to be polished containing silicon nitride.

The polished object to be polished is preferably a polished semiconductor substrate and more preferably a semiconductor substrate after CMP. The reason for this is that a residue can cause the destruction of a semiconductor device and thus when the polished object to be polished is a polished semiconductor substrate, it is required that the residue can be removed as much as possible in a cleaning step of the semiconductor substrate.

The polished object to be polished containing silicon nitride is not particularly limited, and examples thereof include a polished object to be polished made of silicon nitride alone, and a polished object to be polished in a state where silicon nitride and a material other than silicon nitride are exposed on the surface. Specific examples of the former include a silicon nitride substrate, which is a semiconductor substrate, that has been polished. Regarding the latter, examples of the material other than silicon nitride include a silicon-containing material other than silicon nitride such as silicon oxide or polysilicon, a metal such as tungsten, an alloy, and a metal nitride. Specific examples of the latter include a polished semiconductor substrate having a structure in which a silicon nitride portion and a portion consisting of at least one selected from the group consisting of silicon nitride, polysilicon, and tungsten are exposed.

The surface treatment method according to the above aspect can control the zeta potential of the silicon nitride contained in the polished object to be polished, using the composition for surface treatment. Specifically, the zeta potential of the silicon nitride is controlled to −30 mV or less. The composition for surface treatment according to the above aspect has the function of controlling the zeta potential of the silicon nitride contained in the polished object to be polished. Specifically, the composition for surface treatment according to the above aspect has the function of controlling the zeta potential of the silicon nitride to −30 mV or less.

The zeta potential of the silicon nitride is preferably −65 mV or more, more preferably −60 mV or more, further preferably −55 mV or more, and particularly preferably −50 mV or more. The zeta potential of the silicon nitride is preferably −35 mV or less, more preferably −40 mV or less, further preferably −45 mV or less, and particularly preferably −46 mV or less. When the zeta potential of the silicon nitride is in the above ranges, the effect of removing the residue containing inorganic oxide abrasive grains present on the surface of the polished object to be polished containing silicon nitride is further exerted.

The zeta potential of the silicon nitride can be measured using a solid zeta potential measuring instrument SurPASS 3 manufactured by Anton Paar Japan K. K. Details of the measurement method will be described in Examples.

The zeta potential of the silicon nitride can be controlled, for example, by the type and amount of the zeta potential adjusting agent, the pH of the composition for surface treatment, and the like. By increasing the negative charge of the zeta potential adjusting agent in the state of being present in the composition for surface treatment, the zeta potential of the silicon nitride can be lowered. For example, by selecting a compound having an anionic group as the zeta potential adjusting agent, selecting an acid (salt) group as the anionic group, or above all, selecting a specific acid (salt) group as described later, the zeta potential of the silicon nitride can be further lowered. In addition, by appropriately lowering the pH to a range not too low, the zeta potential of the silicon nitride can be further lowered. Then, by increasing the amount of the zeta potential adjusting agent in the composition for surface treatment, the zeta potential lowering action of the zeta potential adjusting agent can be further enhanced.

[Composition for Surface Treatment]

The composition for surface treatment used in the surface treatment method according to the above aspect contains a zeta potential adjusting agent having a negatively charged functional group and having a viscosity of an aqueous solution having a concentration of 20% by mass at 25° C. of 10 mPa·s or more and a dispersing medium, and the surface treatment method according to the above aspect includes controlling the zeta potential of the silicon nitride and the zeta potential of the inorganic oxide abrasive grains each to −30 mV or less using the composition for surface treatment.

The composition for surface treatment according to the above aspect contains a zeta potential adjusting agent having a negatively charged functional group and having a viscosity of an aqueous solution having a concentration of 20% by mass at 25° C. of 10 mPa·s or more and a dispersing medium, and has the function of controlling the zeta potential of the silicon nitride and the zeta potential of the inorganic oxide abrasive grains each to −30 mV or less.

The composition for surface treatment used in the surface treatment method according to the above aspect and the composition for surface treatment according to the above aspect can each control the zeta potential of the silicon nitride and the zeta potential of the inorganic oxide abrasive grains each to −30 mV or less. The preferable ranges of the zeta potential of the silicon nitride and the zeta potential of the inorganic oxide abrasive grains are each as described above. It is considered that the reason why such control is possible is that the zeta potential adjusting agent contained in the composition for surface treatment has a high affinity for the silicon nitride and the inorganic oxide abrasive grains contained in the polished object to be polished and easily adheres to the surfaces of the silicon nitride and the inorganic oxide abrasive grains. It is considered that the zeta potential adjusting agent leads the zeta potential of the silicon nitride and the zeta potential of the inorganic oxide abrasive grains each to −30 mV or less.

In addition, it is preferable that the composition for surface treatment used in the surface treatment method according to one embodiment of the present invention and the composition for surface treatment according to one embodiment of the present invention can also efficiently remove a pad debris (for example, polyurethane) generated from the pad used in the polishing treatment or the surface treatment. Such a pad debris can also be present as a residue on the surface of the polished object to be polished. When the pad debris is polyurethane, the composition for surface treatment used in the surface treatment method according to one embodiment of the present invention and the composition for surface treatment according to one embodiment of the present invention can efficiently remove the pad debris by controlling the zeta potential of the polyurethane on the surface of the polished object to be polished. Here, the composition for surface treatment preferably controls the zeta potential of the polyurethane to −10 mV or less. The preferable range of the zeta potential of the polyurethane is as described above.

Hereinafter, each component contained in the composition for surface treatment will be described.

[Zeta Potential Adjusting Agent]

The composition for surface treatment contains a zeta potential adjusting agent having a negatively charged functional group and having a viscosity of an aqueous solution having a concentration of 20% by mass at 25° C. of 10 mPa·s or more.

The zeta potential adjusting agent is preferably a polymer. As used herein, the "polymer" refers to a compound having a weight average molecular weight of 1,000 or more. From this, the weight average molecular weight of the zeta potential adjusting agent is not particularly limited, and is preferably 1,000 or more. In addition, the weight average molecular weight of the zeta potential adjusting agent is more preferably 5,000 or more, further preferably 8,000 or more, and particularly preferably 10,000 or more. With these ranges, the effect of removing the residue containing inorganic oxide abrasive grains present on the surface of the polished object to be polished containing silicon nitride further improves. The reason for this is presumed as follows. In the above ranges, the adsorption force to the substrate or the residue becomes larger. Because of this, the zeta potential adjusting agent is more unlikely to be desorbed from the surface of the residue (residue containing inorganic oxide abrasive grains) present on the surface of the polished object to be polished and the surface of the polished object to be polished containing silicon nitride. This allows the zeta potential to be controlled more reliably, providing the reason for the above. The weight average molecular weight of the zeta potential adjusting agent is preferably 1,000,000 or less, more preferably 100,000 or less, further preferably 50,000 or less, and particularly preferably 35,000 or less. With these ranges, the effect of removing the residue containing inorganic oxide abrasive grains present on the surface of the polished object to be polished containing silicon nitride further improves. The reason for this is presumed as follows. The reason is that in the above ranges, the molecular weight of the zeta potential adjusting agent is an appropriate value, and thus the amount of the zeta potential adjusting agent adsorbed on the substrate or the residue becomes a more appropriate amount, and the zeta potential adjusting agent itself is more unlikely to become a residue.

The weight average molecular weight of the zeta potential adjusting agent can be measured as a value in terms of polyethylene glycol using gel permeation chromatography (GPC).

The negatively charged functional group of the zeta potential adjusting agent is not particularly limited, and is preferably an anionic group. Examples of the anionic group include a functional group in which a counterion is dissociated to become an anion. As the anionic group, an acid (salt) group is preferable, and a sulfonic acid (salt) group, a sulfuric acid (salt) group, a phosphonic acid (salt) group, a phosphoric acid (salt) group, a carboxylic acid (salt) group, and the like are more preferable. When the negatively charged functional group is any of these groups, the effect of removing the residue containing inorganic oxide abrasive grains present on the surface of the polished object to be polished containing silicon nitride further improves. The reason for this is presumed as follows. The zeta potential of the silicon nitride in the acidic region is positive, and the zeta potential of a polymer having an anionic group is negative. Because of this, silicon nitride on the surface of the polished object to be polished and the polymer having an anionic group are electrically attracted to each other to further promote the adsorption, providing the reason for the above.

As used herein, the sulfonic acid group refers to a sulfo group, the sulfuric acid group refers to a group represented by —OSO$_3$H, the phosphonic acid group refers to a phospho group (a group represented by —PO$_3$H$_2$), the phosphoric acid group refers to a group represented by —OPO$_3$H$_2$, and the carboxylic acid group refers to a carboxy group. The phosphonic acid salt group and the phosphoric acid salt group may each be an acid salt group in which one H remains.

From these, the zeta potential adjusting agent is preferably a polymer having an anionic group and having a weight average molecular weight of 1,000 or more. The zeta potential adjusting agent is more preferably a polymer having an acid (salt) group and having a weight average molecular weight of 1,000 or more. The zeta potential adjusting agent is further preferably a polymer having at least one functional group selected from the group consisting of a sulfonic acid (salt) group, a sulfuric acid (salt) group, a phosphonic acid (salt) group, a phosphoric acid (salt) group, and a carboxylic acid (salt) group, and having a weight average molecular weight of 1,000 or more. The preferable weight average molecular weights of these polymers are as described above.

Among these, the zeta potential adjusting agent is further preferably a polymer having at least one selected from the group consisting of a sulfonic acid (salt) group and a phosphonic acid (salt) group, and furthermore preferably a polymer having a sulfonic acid (salt) group. In addition, the zeta potential adjusting agent is particularly preferably a polymer having at least one selected from the group consisting of a hydroxyl group and a carboxylic acid (salt) group, and a sulfonic acid (salt) group and most preferably a polymer having a carboxylic acid (salt) group, and a sulfonic acid (salt) group.

The acid (salt) as used herein means that the compound of interest may be in the form of an acid or in the form of a salt. The acid (salt) group as used herein means that the group of interest may be in the form of an acid or in the form of a salt. When the acid is in the form of a salt and when the acid group is in the form of a salt, the salt in each case is not particularly limited, and examples thereof include an alkali metal salt such as a lithium salt, a sodium salt, or a potassium salt, a salt of a Group 2 element such as a calcium salt, an amine salt, and an ammonium salt. Among these, an alkali metal salt is preferable, and a sodium salt is more preferable. The type of the salt may be one alone or a combination of two or more.

(Polymer Having Sulfonic Acid (Salt) Group)

The polymer having a sulfonic acid (salt) group as the polymer having an anionic group is not particularly limited.

Examples of the polymer having a sulfonic acid (salt) group include a polymer obtained by sulfonating a base polymer compound, a salt thereof, and a polymer obtained by (co)polymerizing one or two or more monomers containing a sulfonic acid (salt) group-containing monomer.

Examples of the sulfonic acid (salt) group-containing monomer are not particularly limited and include styrenesulfonic acid, 2-acrylamido-2-methylpropanesulfonic acid, vinylsulfonic acid, allylsulfonic acid, 3-allyloxy-2-hydroxy-propanesulfonic acid, sulfoethyl (meth)acrylate, sulfopropyl (meth)acrylate, 2-hydroxysulfopropyl(meth)acrylate, sulfoethylmaleimide, and salts thereof. These can be used singly or in combinations of two or more. Examples of the types of the salts are as described above.

The polymer obtained by (co)polymerizing one or two or more monomers containing a sulfonic acid (salt) group-containing monomer may contain another constitutional unit. The another constitutional unit maybe one introduced by copolymerizing a monomer other than the monomer having a sulfonic acid (salt) group (sulfonic acid (salt) group-containing monomer) or one introduced by leaving a functional group that has not been converted into a sulfonic acid (salt) group at the time of introducing the sulfonic acid (salt) group.

Examples of the another constitutional unit include a vinyl alcohol unit (a structural moiety represented by —CH$_2$—CH(OH)—; hereinafter also referred to as a "VA unit"). In addition, examples of the another constitutional unit include a non-vinyl alcohol unit (a structural unit derived from a monomer other than vinyl alcohol, hereinafter also referred to as a "non-VA unit"). In addition, the monomer copolymerizable with the sulfonic acid (salt) group-containing monomer constituting the non-VA unit is not particularly limited and is preferably an ethylenically unsaturated monomer. The ethylenically unsaturated monomer is not particularly limited, and examples thereof include an unsaturated carboxylic acid ester, an unsaturated amide, an unsaturated amine, and an aromatic mono- or divinyl compound. The unsaturated carboxylic acid ester is not particularly limited, and examples thereof include methyl (meth)acrylate, ethyl (meth)acrylate, butyl (meth)acrylate, hexyl(meth)acrylate, octyl (meth)acrylate, and ethylhexyl (meth)acrylate. The unsaturated amide is not particularly limited, and examples thereof include (meth)acrylamide, N-methylol(meth)acrylamide, and diacetone(meth)acrylamide. The unsaturated amine is not particularly limited, and examples thereof include aminoethyl (meth)acrylate, N,N-dimethylaminoethyl(meth)acrylate, N,N-diethylaminoethyl (meth)acrylate, and N,N,N-trimethylaminoethyl (meth)acrylate. The aromatic mono- or divinyl compound is not particularly limited, and examples thereof include styrene, α-methylstyrene, chlorostyrene, alkylstyrene, and divinylbenzene. These can be used singly or in combinations of two or more.

In addition, examples of the monomer copolymerizable with the sulfonic acid (salt) group-containing monomer include a monomer having another acid (salt) group, for example, ones given herein as examples of a monomer having another acid (salt) group, and these can be used singly or in combinations of two or more.

The polymer having a sulfonic acid (salt) group is not particularly limited, and examples thereof include sulfonic acid (salt) group-containing polyvinyl alcohol (sulfonic acid (salt)-modified polyvinyl alcohol), sulfonic acid (salt) group-containing polystyrene, sulfonic acid (salt) group-containing polyvinyl acetate (sulfonic acid (salt)-modified polyvinyl acetate), sulfonic acid (salt) group-containing polyester, a sulfonic acid (salt) group-containing (meth) acrylic acid derivative (co)polymer, a copolymer of a (meth) acryloyl group-containing monomer and a sulfonic acid (salt) group-containing monomer, sulfonic acid (salt) group-containing polyisoprene, and a sulfonic acid (salt) group-containing allyl polymer. Among these, sulfonic acid (salt) group-containing polyvinyl alcohol, sulfonic acid (salt) group-containing polystyrene, and a copolymer of a (meth) acryloyl group-containing monomer and a sulfonic acid (salt) group-containing monomer are preferable, sulfonic acid (salt) group-containing polyvinyl alcohol, polystyrenesulfonic acid (salt), and a (co)polymer of a sulfonic acid (salt) group-containing monomer and (meth)acrylic acid (salt) are more preferable, sulfonic acid (salt) group-containing polyvinyl alcohol and a (co)polymer of a sulfonic acid (salt) group-containing monomer and (meth)acrylic acid (salt) are further preferable, and a copolymer of a sulfonic acid (salt) group-containing monomer and acrylic acid (salt) is particularly preferable.

In the description of the polymer having a sulfonic acid (salt) group, examples of the types of the salts are as described above.

As used herein, "(meth)acrylic" is meant to collectively refer to acrylic and methacrylic. Similarly, "(meth)acryloyl" is meant to collectively refer to acryloyl and methacryloyl. Similarly, "(meth)acrylate" is meant to collectively refer to acrylate and methacrylate.

In addition, as used herein, "(co)polymerization" is meant to collectively refer to homopolymerization and copolymerization. Similarly, "(co)polymer" is meant to collectively refer to homopolymer and copolymer.

(Polymer Having Sulfuric Acid (Salt) Group)

The polymer having a sulfuric acid (salt) group as the polymer having an anionic group is not particularly limited. Examples of the polymer having a sulfuric acid (salt) group include a polymer having a sulfuric acid (salt) group obtained by modifying a base polymer compound and a polymer obtained by (co)polymerizing one or two or more monomers containing a sulfuric acid (salt) group-containing monomer.

Examples of the sulfuric acid (salt) group-containing monomer are not particularly limited and include a (meth) acrylic sulfuric acid ester and sulfuric acid (salt) group-containing vinyl alcohol (sulfuric acid (salt)-modified vinyl alcohol). These can be used singly or in combinations of two or more.

The polymer obtained by (co) polymerizing one or two or more monomers containing a sulfuric acid (salt) group-containing monomer may contain another constitutional unit. The description of the another constitutional unit is the same as the description of the polymer having a sulfonic acid (salt) group. The description of a monomer constituting the another constitutional unit is the same as the description of the polymer having a sulfonic acid (salt) group.

Examples of the monomer copolymerizable with the sulfuric acid (salt) group-containing monomer include a monomer having another acid (salt) group, for example, ones given herein as examples of a monomer having another acid (salt) group, and these can be used singly or in combinations of two or more.

Examples of the polymer having a sulfuric acid (salt) group are not particularly limited and include a polyacrylic sulfuric acid ester, a polymethacrylic sulfuric acid ester, and sulfuric acid (salt) group-containing polyvinyl alcohol (sulfuric acid (salt)-modified polyvinyl alcohol).

In the description of the polymer having a sulfuric acid (salt) group, examples of the types of the salts are as described above.

(Polymer Having Phosphonic Acid (Salt) Group)

The polymer having a phosphonic acid (salt) group as the polymer having an anionic group is not particularly limited. Examples of the polymer having a phosphonic acid (salt) group include a polymer having a phosphonic acid (salt) group obtained by modifying a base polymer compound and a polymer obtained by (co) polymerizing one or two or more monomers containing a phosphonic acid (salt) group-containing monomer.

Examples of the phosphonic acid (salt) group-containing monomer are not particularly limited and include vinylphosphonic acid, monovinyl phosphate, allylphosphonic acid, monoallyl phosphate, 3-butenylphosphonic acid, mono-3-butenyl phosphate, 4-vinyloxybutyl phosphate, phosphonoxyethyl acrylate, phosphonoxyethyl methacrylate, mono(2-hydroxy-3-vinyloxypropyl) phosphate, (1-phosphonoxymethyl-2-vinyloxyethyl) phosphate, mono (3-allyloxy)-2-hydroxypropyl) phosphate, mono-2-(allyloxy-1-phosphonoxymethylethyl) phosphate, 2-hydroxy-4-vinyloxymethyl-1,3,2-dioxaphosphole, 2-hydroxy-4-allyloxymethyl-1,3,2-dioxaphosphole, and salts thereof. These can be used singly or in combinations of two or more.

The polymer obtained by (co)polymerizing one or two or more monomers containing a phosphonic acid (salt) group-containing monomer may contain another constitutional unit. The description of the another constitutional unit is the same as the description of the polymer having a sulfonic acid (salt) group. The description of a monomer constituting the another constitutional unit is the same as the description of the polymer having a sulfonic acid (salt) group.

Examples of the monomer copolymerizable with the phosphonic acid (salt) group-containing monomer include a monomer having another acid (salt) group, for example, ones given herein as examples of a monomer having another acid (salt) group, and these can be used singly or in combinations of two or more.

Examples of the polymer having a phosphonic acid (salt) group are not particularly limited and include polyvinylphosphonic acid, polyallylphosphonic acid, phosphonoxyethyl polyacrylate, phosphonoxyethyl polymethacrylate, and salts thereof. Among these, polyvinylphosphonic acid and a salt thereof are preferable, and polyvinylphosphonic acid is more preferable.

In the description of the polymer having a phosphonic acid (salt) group, examples of the types of the salts are as described above.

(Polymer Having Phosphoric Acid (Salt) Group)

The polymer having a phosphoric acid (salt) group as the polymer having an anionic group is not particularly limited. Examples of the polymer having a phosphoric acid (salt) group include a polymer obtained by phosphorylating a base polymer compound, a salt thereof, and a polymer obtained by (co)polymerizing one or two or more monomers containing a phosphoric acid (salt) group-containing monomer.

Examples of the phosphoric acid (salt) group-containing monomer are not particularly limited and include (meth) acryloyloxymethylphosphoric acid, (meth)acryloyloxyethylphosphoric acid, (meth)acryloyloxypropylphosphoric acid, (meth)acryloyloxybutylphosphoric acid, (meth)acryloyloxypentylphosphoric acid, (meth)acryloyloxyhexylphosphoric acid, (meth)acryloyloxyoctylphosphoric acid, (meth)acryloyloxydecylphosphoric acid, (meth)acryloyloxylaurylphosphoric acid, (meth)acryloyloxystearylphosphoric acid, (meth)acryloyloxy-1,4-dimethylcyclohexylphosphoric acid, and salts thereof. These can be used singly or in combinations of two or more.

The polymer obtained by (co)polymerizing one or two or more monomers containing a phosphoric acid (salt) group-containing monomer may contain another constitutional unit. The description of the another constitutional unit is the same as the description of the polymer having a sulfonic acid (salt) group. The description of a monomer constituting the another constitutional unit is the same as the description of the polymer having a sulfonic acid (salt) group.

Examples of the monomer copolymerizable with the phosphoric acid (salt) group-containing monomer include a monomer having another acid (salt) group, for example, ones given herein as examples of a monomer having another acid (salt) group, and these can be used singly or in combinations of two or more.

Specific examples of the polymer having a phosphoric acid (salt) group are not particularly limited and include polyacryloyloxyalkylphosphoric acid, polymethacryloyloxyalkylphosphoric acid, polyacryloyloxy-1,4-dimethylcyclohexylphosphoric acid, polymethacryloyloxy-1,4-dimethylcyclohexylphosphoric acid, and salts thereof.

In the description of the polymer having a phosphoric acid (salt) group, examples of the types of the salts are as described above.

(Polymer Having Carboxylic Acid (Salt) Group)

The polymer having a carboxylic acid (salt) group as the polymer having an anionic group is not particularly limited. Examples of the polymer having a carboxylic acid (salt) group include a polymer obtained by carboxylating a base polymer compound, a salt thereof, and a polymer obtained by (co)polymerizing one or two or more monomers containing a carboxylic acid (salt) group-containing monomer.

Examples of the carboxylic acid (salt) group-containing monomer are not particularly limited and include (meth) acrylic acid, itaconic acid, maleic acid, fumaric acid, crotonic acid, and salts thereof. These can be used singly or in combinations of two or more.

The polymer obtained by (co)polymerizing one or two or more monomers containing a carboxylic acid (salt) group-containing monomer may contain another constitutional unit. The description of the another constitutional unit is the same as the description of the polymer having a sulfonic acid (salt) group. The description of a monomer constituting the another constitutional unit is the same as the description of the polymer having a sulfonic acid (salt) group.

Examples of the monomer copolymerizable with the carboxylic acid (salt) group-containing monomer include a monomer having another acid (salt) group, for example, ones given herein as examples of a monomer having another acid (salt) group, and these can be used singly or in combinations of two or more.

Examples of the polymer having a carboxylic acid (salt) group are not particularly limited and include polyacrylic acid, polymethacrylic acid, a copolymer of acrylic acid and methacrylic acid, and salts thereof.

In the description of the polymer having a carboxylic acid (salt) group, examples of the types of the salts are as described above.

When the above polymer having an acid (salt) group or the above polymer having at least one functional group selected from the group consisting of a sulfonic acid (salt) group, a sulfuric acid (salt) group, a phosphonic acid (salt) group, a phosphoric acid (salt) group, and a carboxylic acid (salt) group is in the form of a salt, in the zeta potential adjusting agent, only a part of the acid groups in the molecule may form a salt or all acid groups in the molecule may form salts.

From these, preferable examples of the zeta potential adjusting agent include a copolymer of a sulfonic acid (salt) group-containing monomer and acrylic acid (salt), polyvinylphosphonic acid (salt), and sulfonic acid (salt) group-containing polyvinyl alcohol. Among these, a copolymer of a sulfonic acid group-containing monomer and acrylic acid, a sodium salt of a copolymer of a sulfonic acid group-containing monomer and acrylic acid, sulfonic acid group-containing polyvinyl alcohol, and a sodium salt of sulfonic acid group-containing polyvinyl alcohol are preferable, a copolymer of a sulfonic acid group-containing monomer and acrylic acid, and a sodium salt thereof is more preferable, and a sodium salt of a copolymer of a sulfonic acid group-containing monomer and acrylic acid is further preferable.

When the viscosity of an aqueous solution having a concentration of 20% by mass at 25° C. of the zeta potential adjusting agent is less than 10 mPa·s, the effect of removing the residue containing inorganic oxide abrasive grains present on the surface of the polished object to be polished containing silicon nitride cannot be sufficiently obtained. The reason for this is presumed to be that in the above range, when the zeta potential adjusting agent electrostatically adheres to the surface of the residue (residue containing inorganic oxide abrasive grains) present on the surface of the polished object to be polished and the surface of the polished object to be polished containing silicon nitride, the action as a protective film of the zeta potential adjusting agent cannot be sufficiently obtained. The viscosity of the aqueous solution having a concentration of 20% by mass at 25° C. is not particularly limited as long as it is 10 mPa·s or more, and is preferably 15 mPa·s or less, more preferably 12 mPa·s or less, and further preferably 10.5 mPa·s or less. With these ranges, the effect of removing the residue containing inorganic oxide abrasive grains present on the surface of the polished object to be polished containing silicon nitride further improves. The reason for this is presumed as follows. In the above ranges, it is easier to remove the zeta potential adjusting agent electrostatically adhering to the surface of the residue (residue containing inorganic oxide abrasive grains) present on the surface of the polished object to be polished and the surface of the polished object to be polished containing silicon nitride. As a result, the possibility that the zeta potential adjusting agent itself becomes a residue is more unlikely to occur, providing the reason for the above.

Here, the viscosity of an aqueous solution having a concentration of 20% by mass at 25° C. of the zeta potential adjusting agent refers to a value obtained by using a kinematic viscometer to measure the viscosity (mPa·s) at a water temperature of 25° C. of an aqueous solution that is obtained by mixing a zeta potential adjusting agent and water (deionized water) and has a concentration of the zeta potential adjusting agent of 20% by mass based on the total mass of the aqueous solution. Details of the measurement method will be described in Examples.

As the zeta potential adjusting agent, a commercially available product or a synthetic product may be used. The production method in the case of synthesis is not particularly limited, and the zeta potential adjusting agent can be obtained by a known synthesis method. The commercially available product is not particularly limited, and examples thereof include product numbers: Aron (registered trademark) A-12SL, A-6012, A-6016A, A-6017, A-6020, and A-6031, manufactured by Toagosei Co., Ltd., product numbers: AQUALIC (registered trademark) L series GL-246, GL-366, GL-386, and GH-234, manufactured by Nippon Shokubai Co., Ltd., product number: PVphos acid, 30%, manufactured by FUJIFILM Wako Pure Chemical Corporation, and product numbers GOHSENX (registered trademark) L-3266 and CKS-50, manufactured by Mitsubishi Chemical Corporation.

Such zeta potential adjusting agents can be used singly or in combinations of two or more.

The content (concentration) of the zeta potential adjusting agent (in the case of two or more, the total content thereof) is not particularly limited, and is preferably 0.01 g/kg or more, more preferably 0.1 g/kg or more, further preferably 0.5 g/kg or more, furthermore preferably 0.8 g/kg or more, and particularly preferably 1 g/kg or more based on the total mass of the composition for surface treatment. With these ranges, the effect of removing the residue containing inorganic oxide abrasive grains present on the surface of the polished object to be polished containing silicon nitride further improves. It is presumed that the reason for this is that the amount of the zeta potential adjusting agent is moderately large and a higher action of the zeta potential adjusting agent can be obtained. The content (concentration) of the zeta potential adjusting agent (in the case of two or more, the total content thereof) is not particularly limited, and is preferably 100 g/kg or less, more preferably 10 g/kg or less, further preferably 5 g/kg or less, furthermore preferably 3 g/kg or less, and particularly preferably 2 g/kg or less based on the total mass of the composition for surface treatment. With these ranges, the effect of removing the residue containing inorganic oxide abrasive grains present on the surface of the polished object to be polished containing silicon nitride further improves. It is presumed that the reason for this is that the content of the zeta potential adjusting agent is moderately low and the removal of the zeta potential adjusting agent itself after the surface treatment becomes easier.

[Dispersing Medium]

The composition for surface treatment contains a dispersing medium (solvent) for dissolving or dispersing each component. The dispersing medium preferably contains water, and more preferably is water alone. In addition, the dispersing medium may be a mixed solvent of water and an organic solvent for dispersion or dissolution of each component. Examples of the organic solvent include an alcohol such as methanol, ethanol, isopropanol, ethylene glycol, propylene glycol, or glycerin; a ketone such as acetone; and acetonitrile. The dispersing medium is not particularly limited, and examples thereof include water; an alcohol such as methanol, ethanol, isopropanol, ethylene glycol, propylene glycol, or glycerin; a ketone such as acetone; acetonitrile; and mixtures thereof. Of these, water is preferable as the dispersing medium. In addition, these organic solvents may be used without being mixed with water to disperse or dissolve each component and then to be mixed with water. These organic solvents can be used singly or in combinations of two or more. When a dispersing medium other than water is contained, the content of water based on the total mass of the dispersing medium is preferably 90% by mass or more and 100% by mass or less and more preferably 99% by mass or more and 100% by mass or less. However, the dispersing medium is most preferably water alone.

From the viewpoint of not inhibiting the action of a component contained in the composition for surface treatment, water containing no or a minimum of an impurity is preferable as the dispersing medium. Specifically, pure water, which is deionized water obtained by removing an impurity ion using an ion exchange resin and then removing a foreign substance through a filter, ultrapure water, or distilled water is more preferable.

[PH and pH Adjusting Agent]

The pH of the composition for surface treatment is not particularly limited, and is preferably 1 or more and less than 7. The pH of the composition for surface treatment is more preferably 1.5 or more, further preferably 2 or more, and particularly preferably 2.5 or more. The pH of the composition for surface treatment is more preferably less than 5, further preferably 4 or less, and particularly preferably 3.5 or less. With these ranges, the effect of removing the residue containing inorganic oxide abrasive grains present on the surface of the polished object to be polished containing silicon nitride further improves. The reason for this is presumed as follows. With the above ranges, the zeta potential of the silicon nitride when no zeta potential adjusting agent is used is positive, and the absolute value thereof becomes larger (for example, the absolute value of the zeta potential (mV) may be 40 or more and 50 or less). As a result, when a zeta potential adjusting agent is used, the zeta potential adjusting agent is more strongly adsorbed to the silicon nitride on the surface of the polished object to be polished, and the surface of the polished object to be polished containing silicon nitride is more easily negatively charged, providing the reason for the above. From this, one preferable example of the pH range of the composition for surface treatment is 2 or more and less than 5.

The pH of the composition for surface treatment can be measured, for example, using a pH meter (for example, manufactured by HORIBA, Ltd., model number: LAQUA).

The composition for surface treatment used in the surface treatment method according to the above aspect and the composition for surface treatment according to the above aspect each contain a zeta potential adjusting agent and a dispersing medium as essential components, but when it is difficult to obtain the desired pH with these alone, the pH may be adjusted by adding a pH adjusting agent (a pH adjusting agent that is a compound different from the above zeta potential adjusting agent) as long as it does not inhibit the effect of the present invention. In one embodiment of the present invention, the composition for surface treatment further contains a pH adjusting agent.

As the pH adjusting agent, a known acid or base, or a salt thereof can be used.

The acid that can be used as the pH adjusting agent is not particularly limited, and examples thereof include an inorganic acid such as hydrochloric acid, sulfuric acid, nitric acid, hydrofluoric acid, boric acid, carbonic acid, hypophosphorous acid, phosphorous acid, and phosphoric acid, and an organic acid such as formic acid, acetic acid, propionic acid, butyric acid, pentanoic acid, 2-methylbutyric acid, hexanoic acid, 3,3-dimethyl-butyric acid, 2-ethylbutyric acid, 4-methylpentanoic acid, heptanoic acid, 2-methylhexanoic acid, octanoic acid, 2-ethylhexanoic acid, benzoic acid, hydroxyacetic acid, salicylic acid, glyceric acid, oxalic acid, malonic acid, succinic acid, glutaric acid, adipic acid, pimelic acid, maleic acid, phthalic acid, malic acid, tartaric acid, citric acid, lactic acid, diglycolic acid, 2-furancarboxylic acid, 2,5-furandicarboxylic acid, 3-furancarboxylic acid, 2-tetrahydrofurancarboxylic acid, methoxyacetic acid, methoxyphenylacetic acid, 2-hydroxyisobutyric acid, and phenoxyacetic acid. The base that can be used as the pH adjusting agent is not particularly limited, and examples thereof include an amine such as an aliphatic amine or an aromatic amine, an ammonium solution, an organic base such as tetraammonium hydroxide, an alkali metal hydroxide such as potassium hydroxide, a hydroxide of a Group 2 element, an amino acid such as histidine, and ammonia.

The composition for surface treatment contains preferably an acid, more preferably an inorganic acid, further preferably at least one selected from the group consisting of sulfuric acid, nitric acid, phosphorous acid, and phosphoric acid, and particularly preferably nitric acid.

As the pH adjusting agent, a commercially available product or a synthetic product maybe used. Such pH adjusting agents may be used singly or in combinations of two or more.

The amount of the pH adjusting agent added is not particularly limited and may be appropriately adjusted such that the composition for surface treatment has a desired pH.

[Another Additive]

In one embodiment of the present invention, the composition for surface treatment may contain another additive in an arbitrary proportion as necessary as long as it does not inhibit the effect of the present invention. The another additive is not particularly limited, and examples thereof include abrasive grains, a surfactant, an antifungal agent (antiseptic agent), a dissolved gas, a reducing agent, an oxidizing agent, and an alkanolamine. However, in one embodiment of the present invention, it is desirable to add no or a minimum of a component other than the essential components of the composition for surface treatment because such a component can cause a residue. Therefore, the amount of the component other than the essential components added is preferably as small as possible, and the component is more preferably not contained. Above all, in order to further improve the foreign substance removal effect, the composition for surface treatment preferably does not substantially contain abrasive grains. Here, "not substantially contain abrasive grains" means that the content (concentration) of abrasive grains (in the case of two or more, the total content thereof) based on the entire composition for surface treatment (based on the total mass of the composition for surface treatment) is 0.01% by mass or less (lower limit of 0% by mass), and the content is preferably 0.005% by mass or less (lower limit of 0% by mass) and more preferably 0.001% by mass or less (lower limit of 0% by mass).

[Surfactant]

The composition for surface treatment may contain a surfactant. When the composition for surface treatment contains a surfactant, the surfactant that can be used is not particularly limited, and may be an ionic surfactant or a nonionic surfactant.

The surfactant is not particularly limited, and may have a negatively charged functional group. When the surfactant has a negatively charged functional group, the surfactant having a negatively charged functional group refers to a compound different from the above zeta potential adjusting agent.

When the composition for surface treatment contains a surfactant, an anionic surfactant is preferable as the surfactant that can be used. Examples of the anionic surfactant include a compound containing at least one functional group selected from the group consisting of a sulfonic acid salt group, a sulfuric acid salt group, a phosphonic acid salt group, and a phosphoric acid salt group. More specifically, examples of the anionic surfactant include a compound having a sulfonic acid salt group, a compound having a sulfuric acid salt group, a compound having a phosphonic acid salt group, and a compound having a phosphoric acid salt group.

The surfactant is preferably a low molecular weight type surfactant. The low molecular weight type surfactant refers to a compound having a molecular weight of less than 1000. The molecular weight of the low molecular weight type surfactant is more preferably 200 or more and less than 1,000, further preferably 500 or more and 980 or less, and further preferably 800 or more and 959 or less. The molecular weight of the low molecular weight type surfactant can be measured, for example, using a known mass spectrometric means such as TOF-MS or LC-MS. The weight average molecular weight of the surfactant is preferably less than 1,000, more preferably 200 or more and less than 1,000, further preferably 500 or more and 980 or less, and further preferably 800 or more and 959 or less. The weight average molecular weight can be measured as a value in terms of polyethylene glycol using gel permeation chromatography (GPC).

Such surfactants can be used singly or in combinations of two or more.

The lower limit of the content (concentration) of the surfactant is not particularly limited, and is preferably 0.001 g/kg or more, more preferably 0.01 g/kg or more, further preferably 0.03 g/kg or more, particularly preferably 0.05 g/kg or more, and most preferably 0.08 g/kg or more based on the total mass of the composition for surface treatment. The upper limit of the content (concentration) of the surfactant is not particularly limited, and is preferably 10 g/kg or less, more preferably 5 g/kg or less, further preferably 1 g/kg or less, particularly preferably 0.5 g/kg or less, and most preferably 0.3 g/kg or less based on the total mass of the composition for surface treatment. When the composition for surface treatment contains two or more surfactants, the above content is intended to be the total amount thereof.

[Antifungal Agent]

The composition for surface treatment may contain an antifungal agent (antiseptic agent). When the composition for surface treatment contains an antifungal agent (antiseptic agent), the antifungal agent (antiseptic agent) that can be used is not particularly limited. Specific examples of the antifungal agent (antiseptic agent) include an isothiazolin-based antiseptic agent such as 2-methyl-4-isothiazolin-3-one or 5-chloro-2-methyl-4-isothiazolin-3-one, and phenoxyethanol.

Such antifungal agents (antiseptic agents) may be used singly or in combinations of two or more.

When the composition for surface treatment contains an antifungal agent (antiseptic agent), the lower limit of the content (concentration) of the antifungal agent (antiseptic agent) is not particularly limited, and is preferably 0.0001% by mass or more, more preferably 0.001% by mass or more, further preferably 0.005% by mass or more, and particularly preferably 0.01% by mass or more based on the total mass of the composition for surface treatment. In addition, the upper limit of the content (concentration) of the antifungal agent (antiseptic agent) is not particularly limited, and is preferably 5% by mass or less, more preferably 1% by mass or less, further preferably 0.5% by mass or less, and particularly preferably 0.1% by mass or less based on the total mass of the composition for surface treatment. That is, the content (concentration) of the antifungal agent (antiseptic agent) in the composition for surface treatment is preferably 0.0001% by mass or more and 5% by mass or less, more preferably 0.001% by mass or more and 1% by mass or less, further preferably 0.005% by mass or more and 0.5% by mass or less, and particularly preferably 0.01% by mass or more and 0.1% by mass or less based on the total mass of the composition for surface treatment. With such ranges, a sufficient effect to inactivate or destroy a microorganism can be obtained. When the composition for surface treatment contains two or more antifungal agents (antiseptic agents), the above content is intended to be the total amount thereof.

That is, in one embodiment of the present invention, the composition for surface treatment is substantially composed of a zeta potential adjusting agent, a pH adjusting agent, a dispersing medium, and at least one selected from the group consisting of a surfactant and an antifungal agent. In one embodiment of the present invention, the composition for surface treatment is substantially composed of a zeta potential adjusting agent, a pH adjusting agent, water, and at least one selected from the group consisting of a surfactant, an antifungal agent, and an organic solvent. In one embodiment of the present invention, the composition for surface treatment is substantially composed of a zeta potential adjusting agent, a pH adjusting agent, water, and at least one selected from the group consisting of an antifungal agent and an organic solvent. In one embodiment of the present invention, the composition for surface treatment is substantially composed of a zeta potential adjusting agent, a pH adjusting agent, and water. In these embodiments, "the composition for surface treatment is substantially composed of X" means that the total content (total concentration) of X exceeds 99% by mass (upper limit: 100% by mass) with the total mass of the composition for surface treatment as 100% by mass (based on the total mass of the composition for surface treatment). Preferably, the composition for surface treatment is composed of X (the above total content=100% by mass). For example, "the composition for surface treatment is substantially composed of a zeta potential adjusting agent, a pH adjusting agent, water, and at least one selected from the group consisting of a surfactant, an antifungal agent, and an organic solvent" means that the total content (total concentration) of a zeta potential adjusting agent, a pH adjusting agent, water, and at least one selected from the group consisting of a surfactant, an antifungal agent, and an organic solvent exceeds 99% by mass (upper limit: 100% by mass) with the total mass of the composition for surface treatment as 100% by mass (based on the total mass of the composition for surface treatment). At this time, the composition for surface treatment is preferably composed of a zeta potential adjusting agent, a pH adjusting agent, water, and at least one selected from the group consisting of a surfactant, an antifungal agent, and an organic solvent (the above total content=100% by mass).

[Method for Producing Composition for Surface Treatment]

The method for producing a composition for surface treatment is not particularly limited. For example, the composition for surface treatment can be produced by mixing a zeta potential adjusting agent having a negatively charged functional group and having a viscosity of an aqueous solution having a concentration of 20% by mass at 25° C. of 10 mPa·s or more and a dispersing medium (for example, water).

That is, according to another aspect of the present invention, the above method for producing a composition for surface treatment including mixing a zeta potential adjusting agent having a negatively charged functional group and having a viscosity of an aqueous solution having a concentration of 20% by mass at 25° C. of 10 mPa·s or more and a dispersing medium is also provided. The type of the above zeta potential adjusting agent, the amount thereof added, and the like are as described above. In the method for producing a composition for surface treatment according to one embodiment of the present invention, another component other than the zeta potential adjusting agent and the dispersing medium may be further mixed as necessary. The type thereof, the amount thereof added, and the like are as described above.

The order of addition and the method for addition of each component contained in the composition for surface treatment are not particularly limited. In addition, the mixing method is not particularly limited, and a known method can be used. The above method for producing a composition for surface treatment may further include measuring and adjusting the pH of the composition for surface treatment in such a way as to obtain a desired pH.

[Surface Treatment]

The surface treatment method according to one embodiment of the present invention is carried out by a method including contacting a composition for surface treatment directly with a polished object to be polished containing silicon nitride. The surface treatment method is not particularly limited, and examples thereof include a method by a rinse polishing treatment and a method by a cleaning treatment. From this, the surface treatment method according to one embodiment of the present invention is a rinse polishing treatment method or a cleaning treatment method. In addition, the composition for surface treatment according to one embodiment of the present invention is a rinse polishing composition or a cleaning composition. The rinse polishing treatment and the cleaning treatment are carried out in order to remove a foreign substance (a residue such as inorganic oxide abrasive grains or a pad debris, metal contamination, or the like) on the surface of the polished object to be polished to obtain a clean surface.

The composition for surface treatment is particularly suitably used in the rinse polishing treatment. The rinse polishing treatment refers to a treatment that is carried out on a platen to which a polishing pad is attached and that removes a residue on the surface of a polished object to be polished by the frictional force (physical action) by the polishing pad and the action of the composition for surface treatment. Specific examples of the rinse polishing treatment are not particularly limited and include a treatment in which after subjecting an object to be polished to polishing (for example, final polishing or finish polishing), the polished object to be polished and the polishing pad are contacted with each other with the polished object to be polished placed on a platen of a polishing apparatus, and the polished object to be polished and the polishing pad are slid relative to each other while supplying a composition for surface treatment to the contact portion. The rinse polishing treatment may be carried out on the same platen as the platen used for polishing (for example, final polishing or finish polishing) of an object to be polished, or on a platen different from the platen used for the above polishing. Among these, the rinsing polishing treatment is preferably carried out on a platen different from the platen used for polishing (for example, final polishing or finish polishing) of an object to be polished.

The rinse polishing treatment is carried out by contacting a composition for surface treatment directly with a polished object to be polished containing silicon nitride. It is considered that silicon nitride, inorganic oxide abrasive grains, and optionally also polyurethane are negatively charged by the adhesion of the zeta potential adjusting agent by the action of the composition for surface treatment. Then, the frictional force (physical action) of the polishing pad and the action of the composition for surface treatment remove the inorganic oxide abrasive grains and optionally also polyurethane from the surface of the polished object to be polished containing silicon nitride and prevent readhesion thereof. At this time, by utilizing the friction with the polishing pad on the platen (the friction between the polishing pad and a residue), a residue such as inorganic oxide abrasive grains or a pad debris is more effectively removed. Then, after the rinse polishing treatment, a process such as cleaning with water (post-cleaning treatment described later) is carried out, and thereby the zeta potential adjusting agent on the surface of the silicon nitride is easily removed. As a result, it is possible to obtain a polished object to be polished containing silicon nitride, in which a residue containing inorganic oxide abrasive grains is remarkably reduced.

The rinse polishing treatment is not particularly limited, and is preferably carried out using a general polishing apparatus to which a holder for holding an object to be polished, a motor whose rotation speed can be changed, and the like are attached and which has a platen to which a polishing pad (polishing cloth) can be bonded. As the polishing apparatus, either a single-sided polishing apparatus or a double-sided polishing apparatus may be used. As the polishing pad, a general non-woven fabric, polyurethane, a porous fluororesin, or the like can be used without particular limitation, and polyurethane is preferable from the viewpoint of further residue reduction. The polishing pad is preferably subjected to groove processing such that a polishing liquid can collect. In addition, when chemical mechanical polishing and the rinse polishing treatment are carried out using the same polishing apparatus, the polishing apparatus preferably includes a discharge nozzle for the composition for surface treatment in addition to a discharge nozzle for the polishing composition.

Here, the treatment conditions are not particularly limited, and for example, the pressure between the polished object to be polished and the polishing pad is preferably 0.5 psi (3.5 kPa) or more and 10 psi (69 kPa) or less. The head rotation speed is preferably 10 rpm ($0.17$ $s^{-1}$) or more and 100 rpm ($1.7$ $s^{-1}$) or less. In addition, the platen rotation speed is preferably 10 rpm ($0.17$ $s^{-1}$) or more and 100 rpm ($1.7$ $s^{-1}$) or less. There is no limitation on the supply rate in continuous pouring without recycle, and the surface of the polished object to be polished is preferably covered with the composition for surface treatment, and is, for example, 10 mL/min or more and 5000 mL/min or less. In addition, the surface treatment time is not particularly limited, and is preferably 5 seconds or more and 180 seconds or less. With such a range, a foreign substance (particularly, a residue such as inorganic oxide abrasive grains or a pad debris) can be better removed. The temperature of the composition for surface treatment during the rinse polishing treatment is not particularly limited and may be usually room temperature (25° C.), and the composition for surface treatment may be heated to about 40° C. or more and 70° C. or less as long as the performance is not impaired.

The composition for surface treatment is also suitably used in the cleaning treatment. As used herein, the cleaning treatment refers to a treatment that is carried out in a state where the polished object to be polished is detached from the platen and that mainly removes a residue on the surface of the polished object to be polished by the action of the composition for surface treatment. Specific examples of the cleaning treatment include a treatment in which after subjecting an object to be polished to polishing (for example, final polishing or finish polishing) or after carrying out a rinse polishing treatment following the polishing, the polished object to be polished is detached from the platen and contacted with the composition for surface treatment. A means that applies a frictional force (physical action) to the surface of the polished object to be polished in a state where the composition for surface treatment and the polished object to be polished are in contact with each other may be further used.

The cleaning treatment method is not particularly limited, and examples thereof include a method of immersing a polished object to be polished in a composition for surface treatment and carrying out ultrasonic treatment as necessary, and a method of contacting a cleaning brush and a polished object to be polished with each other while holding the polished object to be polished to scrub the surface of the polished object to be polished using a brush while supplying a composition for surface treatment to the contact portion.

The cleaning treatment apparatus is not particularly limited, and examples thereof include a batch-type cleaning apparatus that simultaneously surface-treats a plurality of polished objects to be polished accommodated in a cassette, a single thin piece-type cleaning apparatus that surface-treats one polished object to be polished attached to a holder, and a polishing apparatus equipped with a cleaning facility that can scrub a polished object to be polished after detached from the platen using a cleaning brush. Here, as the polishing apparatus, a general polishing apparatus having a holder for holding a polished object to be polished, a motor whose rotation speed can be changed, a cleaning brush, and the like can be used. In addition, the cleaning brush is not particularly limited, and examples thereof include a resin brush such as a PVA (polyvinyl alcohol) brush.

The cleaning conditions are not particularly limited and can be appropriately set according to the type of the polished object to be polished and the type and amount of the impurity to be removed.

[Post-Cleaning Treatment]

As the surface treatment method according to one embodiment of the present invention, the polished object to be polished may be further subjected to a cleaning treatment after surface treatment. As used herein, this cleaning treatment is referred to as a post-cleaning treatment. Specific examples of the post-cleaning treatment are not particularly limited and include a method of continuously pouring water without recycle over a polished object to be polished after surface treatment, a method of immersing a polished object to be polished after surface treatment in water, and a method of scrubbing a polished object to be polished after surface treatment using a cleaning brush while continuously pouring water without recycle. The method, apparatus, and conditions of the post-cleaning treatment are not particularly limited, and for example, the description of the cleaning treatment can be referred to. Water used for the post-cleaning treatment is not particularly limited, and it is particularly preferable to use deionized water.

In one embodiment of the present invention, by carrying out surface treatment with the composition for surface treatment, the residue is brought into a state of being able to be extremely easily removed. Because of this, by carrying out surface treatment using the composition for surface treatment and then carrying out further cleaning treatment using water, the residue is removed extremely well.

The polished object to be polished after the post-cleaning is preferably dried by throwing out a water droplet adhering to the surface using a spin dryer or the like. In addition, the surface of the polished object to be polished may be dried by air blow drying.

According to the surface treatment method according to the above aspect and the composition for surface treatment according to the above aspect, each can sufficiently remove the residue remaining on the surface of the polished object to be polished containing silicon nitride. That is, according to another aspect of the present invention, it can also be deemed that a method for reducing a residue on the surface of a polished object to be polished containing silicon nitride, by surface-treating the polished object to be polished containing silicon nitride using the above composition for surface treatment, is provided.

The residue on the surface of the polished object to be polished removed by the composition for surface treatment contains a residue that is caused to adhere by the polishing treatment to which the object to be polished is subjected. That is, the inorganic oxide abrasive grains are a residue derived from the polishing composition, and the pad debris (for example, polyurethane) is a residue derived from the polishing pad used in the polishing treatment. Therefore, the polishing composition and the polishing treatment from which these residues are derived will be described. In other words, how to obtain the polished object to be polished, which is to be subjected to surface treatment, will be described.

[Polishing Composition]

The polishing composition used to obtain the polished object to be polished, which is to be subjected to surface treatment, contains inorganic oxide abrasive grains and a dispersing medium. The polishing composition may further contain an additive, as necessary. The configuration of the polishing composition is not particularly limited except that inorganic oxide abrasive grains and a dispersing medium are essential, and a preferable configuration of the polishing composition will be described below.

[Abrasion Grains]

The inorganic oxide abrasive grains contained in the polishing composition are not particularly limited, and examples thereof include particles made of an inorganic oxide (metal oxide) such as silicon oxide (silica), aluminum oxide (alumina), cerium oxide (ceria), zirconium oxide (zirconia), or titanium oxide (titania). These particles made of an inorganic oxide may be surface-modified. For example, the particles may be made of an anion-modified inorganic oxide abrasive grains on which an organic acid such as a carboxylic acid or a sulfonic acid is immobilized. As such an anion-modified inorganic oxide abrasive grains, anion-modified silicon oxide on which an organic acid such as a carboxylic acid or a sulfonic acid is immobilized is preferable, and anion-modified colloidal silica on which an organic acid such as a carboxylic acid or a sulfonic acid is immobilized is more preferable. Such immobilization of an organic acid on the surface of an inorganic oxide abrasive grains is carried out, for example, by chemically bonding an organic acid functional group to the surface of the inorganic oxide abrasive grains. The immobilization of an organic acid on an inorganic oxide abrasive grains cannot be achieved by simply allowing the inorganic oxide abrasive grains and the organic acid to coexist. For example, if sulfonic acid, which is one organic acid, is to be immobilized on colloidal silica, the immobilization can be carried out, for example, by the method described in "Sulfonic acid-functionalized silica through quantitative oxidation of thiol groups", Chem. Commun. 246-247 (2003). Specifically, it is possible to obtain anion-modified colloidal silica in which sulfonic acid is immobilized on the surface thereof by coupling a silane coupling agent having a thiol group such as 3-mercaptopropyltrimethoxysilane to colloidal silica and then oxidizing the thiol group using hydrogen peroxide. Alternatively, if a carboxylic acid is to be immobilized on colloidal silica, the immobilization can be carried out, for example, by the method described in "Novel Silane Coupling Agents Containing a Photolabile 2-Nitrobenzyl Ester for Introduction of a Carboxy Group on the Surface of Silica Gel", Chemistry Letters, 3, 228-229 (2000). Specifically, it is possible to obtain anion-modified colloidal silica in which a carboxylic acid is immobilized on the surface thereof by coupling a silane coupling agent containing a photoreactive 2-nitrobenzyl ester to colloidal silica followed by photoirradiation. Among these, anion-modified silicon oxide in which a sulfonic acid is immobilized on the surface thereof (as used herein, also referred to as sulfonic acid-modified silicon oxide) is preferable, and anionic-modified colloidal silica in which a sulfonic acid is immobilized on the surface thereof (as used herein, also referred to as sulfonic acid-modified colloidal silica) is more preferable. The organic acid immobilized on the surface of the inorganic oxide abrasive grains may be in the state of an acid or in the state of a salt.

As the inorganic oxide abrasive grains, at least one selected from the group consisting of anion-modified silicon oxide abrasive grains and cerium oxide abrasive grains is more preferable, and cerium oxide abrasive grains are particularly preferable from the viewpoint of the removal effect of the composition for surface treatment. The anion-modified silicon oxide abrasive grains and the cerium oxide abrasive grains are easily negatively charged when contacted with the composition for surface treatment, and are easily removed from the surface of a polished object to be polished by cleaning treatment or the like after surface treatment.

The lower limit of the average primary particle size of the inorganic oxide abrasive grains is not particularly limited, and is preferably 5 nm or more, more preferably 7 nm or more, and further preferably 10 nm or more. With these ranges, the desired polishing speed can be easily obtained. The upper limit of the average primary particle size of the inorganic oxide abrasive grains is not particularly limited, and is preferably 50 nm or less, more preferably 40 nm or less, and further preferably 30 nm or less. With these ranges, the effect of removing the residue containing inorganic oxide abrasive grains present on the surface of the polished object to be polished containing silicon nitride is further exerted. The value of the average primary particle size of the inorganic oxide abrasive grains can be calculated on the assumption that the particle shape of the inorganic oxide abrasive grains is a true sphere, based on the specific surface area of the inorganic oxide abrasive grains measured by the BET method.

The lower limit of the average secondary particle size of the inorganic oxide abrasive grains is not particularly limited, and is preferably 5 nm or more, more preferably 10 nm or more, and further preferably 20 nm or more. With these ranges, the desired polishing speed can be easily obtained. The upper limit of the average secondary particle size of the inorganic oxide abrasive grains is not particularly limited, and is preferably 100 nm or less, more preferably 90 nm or less, and further preferably 80 nm or less. With these ranges, the effect of removing the residue containing inorganic oxide abrasive grains present on the surface of the polished object to be polished containing silicon nitride is further exerted. The value of the average secondary particle size of the inorganic oxide abrasive grains can be calculated based on a light scattering method measurement using a laser beam.

As the inorganic oxide abrasive grains, a synthetic product or a commercially available product may be used. Such inorganic oxide abrasive grains may be used singly or in combinations of two or more.

The content (concentration) of the inorganic oxide abrasive grains (in the case of two or more, the total content thereof) in the polishing composition is not particularly limited, and is preferably more than 0.01% by mass, more preferably 0.1% by mass or more, and further preferably 0.2% by mass or more based on the total mass of the polishing composition. With these ranges, the desired polishing speed can be easily obtained. The content (concentration) of the inorganic oxide abrasive grains (in the case of two or more, the total content thereof) in the polishing composition is not particularly limited, and is preferably 10% by mass or less, more preferably 5% by mass or less, and further preferably 3% by mass or less based on the total mass of the polishing composition. With these ranges, the effect of removing the residue containing inorganic oxide abrasive grains present on the surface of the polished object to be polished containing silicon nitride is further exerted.

[Another Component]

The polishing composition may contain another component (additive) other than the inorganic oxide abrasive grains and the dispersing medium. The another component is not particularly limited, and examples thereof include a component used in a known polishing composition, such as a dispersant (an additive that improves the redispersibility of abrasive grains that have once settled), an electric conductivity adjusting agent (an additive that adjusts the electric conductivity of the polishing composition), abrasive grains other than inorganic oxide abrasive grains, a pH adjusting agent, a surfactant, a wetting agent, a chelating agent, an antiseptic agent, an antifungal agent, a dissolved gas, an oxidizing agent, and a reducing agent. The pH adjusting agent is not particularly limited, and for example, the pH adjusting agents mentioned in the above description of the composition for surface treatment can be used.

[Polishing Treatment]

The polishing treatment carried out using a polishing composition is a treatment that polishes an object to be polished to form a polished object to be polished.

The polishing treatment is not particularly limited as long as it polishes an object to be polished, and is preferably a Chemical Mechanical Polishing (CMP) treatment. In addition, the polishing treatment may be a polishing step consisting of a single step or a polishing step consisting of a plurality of steps. Examples of the polishing step consisting of a plurality of steps include a step of carrying out a finish polishing step after a preliminary polishing step (rough polishing step) and a step of carrying out one or two or more secondary polishing steps after a primary polishing step and then carrying out a finish polishing step. The surface treatment step including carrying out the surface treatment method according to the above aspect and the surface treatment step using the composition for surface treatment according to the above aspect are preferably carried out after a finish polishing step.

As a polishing apparatus, a general polishing apparatus to which a holder for holding an object to be polished, a motor whose rotation speed can be changed, and the like are attached and which has a platen to which a polishing pad (polishing cloth) can be bonded can be used. As the polishing apparatus, either a single-sided polishing apparatus or a double-sided polishing apparatus may be used.

As the polishing pad used in the polishing step, a general non-woven fabric, polyurethane, a porous fluororesin, or the like can be used without particular limitation. However, in each of a surface treatment step including carrying out the surface treatment method according to the above aspect and a surface treatment step using the composition for surface treatment according to the above aspect, the polishing pad is made of preferably polyurethane from the viewpoint of further residue reduction. A component derived from the polishing pad may adhere to the surface of a polished object to be polished. When the polishing pad is made of polyurethane, the residue will further contain polyurethane. The surface treatment method according to one preferable embodiment of the present invention preferably further includes controlling the zeta potential of polyurethane to −10 mV or less using a composition for surface treatment. The composition for surface treatment according to one preferable embodiment of the present invention preferably further has the function of controlling the zeta potential of polyurethane to −10 mV or less. As a result thereof, the residue (polyurethane) can be efficiently removed.

The Shore A hardness of the polishing pad used for the polishing treatment is preferably 40° or more, more preferably 60° or more, further preferably 70° or more, furthermore preferably 75° or more, particularly preferably 80° or more, and most preferably 85° or more. The Shore A hardness of the polishing pad used in the polishing treatment is preferably 100° or less, more preferably 99° or less, further preferably 97° or less, furthermore preferably 95° or less, and particularly preferably 93° or less. When the Shore A hardness of the polishing pad used for the polishing treatment is within the above ranges, the polishing pad and the object to be polished come into contact with each other at an appropriate pressure to provide the following effects: the polishing not only can be carried out efficiently, but also the residue on the surface of the polished object to be polished does not easily remain. Examples of the Shore A hardness of the polishing pad include 40° or more and 100° or less.

The Shore A hardness of the polishing pad is a value measured based on a type A durometer according to JIS K 6253-3:2012.

The polishing pad is preferably subjected to groove processing such that a polishing liquid can collect.

The polishing conditions are not particularly limited, and for example, the rotation speed of the platen and the head (carrier) rotation speed are preferably 10 rpm (0.17 s$^{-1}$) or more and 100 rpm (1.7 s$^{-1}$) or less, and the pressure (polishing pressure) applied to the object to be polished is preferably 0.5 psi (3.5 kPa) or more and 10 psi (69 kPa) or less. The method for supplying the polishing composition to the polishing pad is not particularly limited, and for example, a method for continuously supplying (continuously pouring without recycle) the polishing composition using a pump or the like is adopted. The supply rate is not limited, the surface of the polishing pad is preferably always covered with the polishing composition, and the supply rate is preferably 10 mL/min or more and 5000 mL/min or less. The polishing time is not particularly limited, and is preferably 5 seconds or more and 180 seconds or less. The temperature of the polishing composition during the polishing treatment is not particularly limited and may be usually room temperature (25° C.), and the polishing composition may be heated to about 40° C. or more and 70° C. or less as long as the performance is not impaired.

[Method for Producing Semiconductor Substrate]

The surface treatment method according to the above aspect and the composition for surface treatment according to the above aspect can each be suitably applied when the polished object to be polished is a polished semiconductor substrate. According to another aspect of the present invention, a method for producing a semiconductor substrate, including treating the surface of a polished object to be polished by the above surface treatment method, wherein the polished object to be polished is a polished semiconductor substrate, is also provided.

The method for producing a semiconductor substrate preferably includes a polishing step of obtaining a polished semiconductor substrate by polishing a semiconductor substrate before polishing and which contains silicon nitride using a polishing composition containing inorganic oxide abrasive grains, wherein the polished semiconductor substrate is a polished object to be polished, and a surface treatment step of reducing a residue containing the inorganic oxide abrasive grains on the surface of the polished semiconductor substrate by the above surface treatment method.

In the method for producing a semiconductor substrate, preferably, the inorganic oxide abrasive grains contain at least one selected from the group consisting of cerium oxide abrasive grains and anion-modified silicon oxide abrasive grains, and the method includes controlling the zeta potential of at least one selected from the group consisting of cerium oxide abrasive grains and anion-modified silicon oxide abrasive grains to −30 mV or less using the composition for surface treatment used in the surface treatment step described above. In the method for producing a semiconductor substrate, more preferably, the inorganic oxide abrasive grains contain cerium oxide abrasive grains, and the method includes controlling the zeta potential of the cerium oxide abrasive grains to −30 mV or less using the composition for surface treatment used in the surface treatment step described above.

In the method for producing a semiconductor substrate, preferably, the polishing step includes using a polishing pad made of polyurethane, the residue further contains polyurethane, and the method further includes controlling the zeta potential of the polyurethane to −10 mV or less using the composition for surface treatment used in the surface treatment step described above.

Details of the semiconductor substrate to which such a producing method is applied are as described in the description of the polished object to be polished which is to be surface-treated by the above composition for surface treatment.

In addition, the method for producing a semiconductor substrate is not particularly limited as long as the method includes a step (surface treatment step) of surface-treating the surface of a polished semiconductor substrate using the above composition for surface treatment or surface-treating the same by the above surface treatment method.

[System for Producing Semiconductor Substrate]

In addition thereto, the above composition for surface treatment also relates to a system for producing a semiconductor substrate, further including an object to be polished containing silicon nitride, a polishing pad, and a polishing composition containing inorganic oxide abrasive grains. According to another aspect of the present invention, a system for producing a semiconductor substrate including an object to be polished containing silicon nitride, a polishing pad, a polishing composition containing inorganic oxide abrasive grains, and the above composition for surface treatment, wherein a surface of the object to be polished after polishing using the polishing composition and the polishing pad is contacted with the above composition for surface treatment is also provided.

Preferable embodiments of the object to be polished containing silicon nitride, the polishing pad, the polishing composition containing inorganic oxide abrasive grains, and the composition for surface treatment which are applied to the system for producing a semiconductor substrate are as described above, and thus the description thereof is omitted.

In one embodiment of the present invention, the system for producing a semiconductor substrate may be a system including contacting both sides of a polished object to be polished with the polishing pad and the composition for surface treatment to simultaneously surface-treat both the sides of the polished object to be polished, or a system including contacting only one side of a polished object to be polished with the polishing pad and the composition for surface treatment to surface-treat only the one side of the polished object to be polished. Preferable embodiments of the surface treatment are as described above, and thus the description thereof is omitted.

[Residue Removal Effect]

A higher effect of removing a residue on the surface of a polished object to be polished of the above composition for surface treatment is more preferable. That is, when surface treatment of the polished object to be polished is carried out using the composition for surface treatment, a smaller number of residues remaining on the surface is more preferable.

Specifically, when the polished object to be polished is surface-treated using the composition for surface treatment, the total number of residues is preferably less than 200,000, more preferably 2,000 or less, further more preferably 1,000 or less, particularly preferably 500 or less, and particularly preferably 300 or less (lower limit of 0). On the other hand, a smaller total number of residues is more preferable, and thus the lower limit thereof is not particularly limited and may be 100 or more, for example.

In addition, when the polished object to be polished is surface-treated using the composition for surface treatment, the number of abrasive grain residues is preferably less than 200,000, more preferably 1,000 or less, further preferably 500 or less, furthermore preferably 250 or less, and particularly preferably 150 or less (lower limit of 0). On the other hand, a smaller number of abrasive grain residues is more preferable, and thus the lower limit thereof is not particularly limited and may be 50 or more, for example.

Then, when the polished object to be polished is surface-treated using the composition for surface treatment, the number of polyurethane residues is preferably 1,000 or less, more preferably 500 or less, further preferably 250 or less, and particularly preferably 150 or less (lower limit of 0). On the other hand, a smaller number of polyurethane residues is more preferable, and thus the lower limit thereof is not particularly limited and may be 50 or more, for example.

As each of the above numbers of various residues, the value measured by the method described in Examples after surface treatment is carried out by the method described in Examples is adopted.

Embodiments of the present invention have been described in detail, but these are descriptive and illustrative and are not limiting, and it is clear that the scope of the invention should be construed by the appended claims.

The present invention encompasses the following aspects and embodiments.

[1] A surface treatment method for reducing a residue containing inorganic oxide abrasive grains on a surface of a polished object to be polished containing silicon nitride using a composition for surface treatment, wherein
the composition for surface treatment contains a zeta potential adjusting agent having a negatively charged functional group and having a viscosity of an aqueous solution having a concentration of 20% by mass at 25° C. of 10 mPa·s or more and a dispersing medium, and
the surface treatment method includes controlling a zeta potential of the silicon nitride and a zeta potential of the inorganic oxide abrasive grains each to −30 mV or less using the composition for surface treatment;

[2] The surface treatment method according to [1], wherein the inorganic oxide abrasive grains contain cerium oxide abrasive grains, and a zeta potential of the cerium oxide abrasive grains is controlled to −30 mV or less using the composition for surface treatment;

[3] The surface treatment method according to [1] or [2], wherein the residue further contains polyurethane, and the surface treatment method further includes controlling a zeta potential of the polyurethane to −10 mV or less using the composition for surface treatment;

[4] The surface treatment method according to any one of [1] to [3], wherein the zeta potential adjusting agent is a polymer having an anionic group and having a weight average molecular weight of 1,000 or more;

[5] The surface treatment method according to [4], wherein the polymer having an anionic group has at least one functional group selected from the group consisting of a sulfonic acid (salt) group, a sulfuric acid (salt) group, a phosphonic acid (salt) group, a phosphoric acid (salt) group, and a carboxylic acid (salt) group;

[6] The surface treatment method according to any one of [1] to [5], wherein the composition for surface treatment further contains a pH adjusting agent;

[7] The surface treatment method according to any one of [1] to [6], wherein a pH value of the composition for surface treatment is 2 or more and less than 5;

[8] The surface treatment method according to any one of [1] to [7], wherein the surface treatment method is a rinse polishing treatment method or a cleaning treatment method;

[9] A method for producing a semiconductor substrate, including:
  a polishing step of obtaining a polished semiconductor substrate by polishing a semiconductor substrate before polishing and which contains silicon nitride using a polishing composition containing inorganic oxide abrasive grains, wherein
  the polished semiconductor substrate is a polished object to be polished, and
  a surface treatment step of reducing a residue containing the inorganic oxide abrasive grains on a surface of the polished semiconductor substrate by the surface treatment method according to any one of [1] to [8];

[10] The method for producing a semiconductor substrate according to [9], wherein
  the inorganic oxide abrasive grains contain cerium oxide abrasive grains, and
  the method includes controlling the zeta potential of the cerium oxide abrasive grains to −30 mV or less using the composition for surface treatment used in the surface treatment step;

[11] The method for producing a semiconductor substrate according to [9] or [10], wherein
  the polishing step includes using a polishing pad made of polyurethane, the residue further contains polyurethane, and
  the method further includes controlling a zeta potential of the polyurethane to −10 mV or less using the composition for surface treatment used in the surface treatment step;

[12] The method for producing a semiconductor substrate according to [11], wherein a Shore A hardness of the polishing pad is 40° or more and 100° or less;

[13] A composition for surface treatment used for reducing a residue containing inorganic oxide abrasive grains on a surface of a polished object to be polished containing silicon nitride,
  the composition for surface treatment containing a zeta potential adjusting agent having a negatively charged functional group and having a viscosity of an aqueous solution having a concentration of 20% by mass at 25° C. of 10 mPa·s or more and a dispersing medium, and
  having a function of controlling a zeta potential of the silicon nitride and a zeta potential of the inorganic oxide abrasive grains each to −30 mV or less;

[14] The composition for surface treatment according to [13], wherein
  the inorganic oxide abrasive grains contain cerium oxide abrasive grains, and
  the composition for surface treatment has a function of controlling a zeta potential of the cerium oxide abrasive grains to −30 mV or less;

[15] The composition for surface treatment according to [13] or [14], wherein
  the residue further contains polyurethane, and
  the composition for surface treatment further has a function of controlling a zeta potential of the polyurethane to −10 mV or less;

[16] The composition for surface treatment according to anyone of [13] to [15], wherein the composition for surface treatment is a rinse polishing composition or a cleaning composition;

[17] A system for producing a semiconductor substrate, including an object to be polished containing silicon nitride, a polishing pad, a polishing composition containing inorganic oxide abrasive grains, and the composition for surface treatment according to any one of [13] to [16], wherein
  a surface of the object to be polished after polishing using the polishing composition and the polishing pad is contacted with the composition for surface treatment.

EXAMPLES

The present invention will be described in more detail with reference to the following Examples and Comparative Examples. However, the technical scope of the present invention is not limited only to the following Examples. Unless otherwise specified, "%" and "parts" mean "% by mass" and "parts by mass," respectively. In addition, in the following Examples, unless otherwise specified, the operations were carried out under conditions of room temperature (20 to 25° C.)/a relative humidity of 40 to 50% RH.

[Preparation of Compositions for Surface Treatment]
[Preparation of Composition for Surface Treatment A1]

Copolymer 1 of a sulfonic acid (salt) group-containing monomer and acrylic acid as a zeta potential adjusting agent (sodium salt, weight average molecular weight of 10,000, manufactured by Toagosei Co., Ltd., product number: Aron (registered trademark) A-6012), nitric acid as a pH adjusting agent, and water (deionized water) as a dispersing medium were mixed to prepare composition for surface treatment A1. The amount (content, concentration) of the zeta potential adjusting agent added was 1.0 g/kg based on the total mass of composition for surface treatment A1, and the amount (content, concentration) of the pH adjusting agent added was an amount that caused the pH of composition for surface treatment A1 to be 3 (liquid temperature: 25° C.). The pH was measured using a pH meter (product name: LAQUA (registered trademark) manufactured by HORIBA, Ltd.).

[Preparation of Compositions for Surface Treatment A2 to A5 and B1 to B6]

Compositions for surface treatment A2 to A5 and B1 to B6 were each prepared in the same manner as in the preparation of composition for surface treatment A1, except that the necessity, the type, and the addition amount (content, concentration) of a zeta potential adjusting agent or a comparative compound (a compound used instead of the zeta potential adjusting agent is referred to as a comparative compound) were selected as shown in Table 1 below, and the amount of the pH adjusting agent was selected such that the pH of the resulting composition for surface treatment was the pH shown in Table 1 below.

Compositions for surface treatment A1 to A5 are the compositions for surface treatment used in the Examples, and compositions for surface treatment B1 to B6 are the compositions for surface treatment used in the Comparative Examples.

Details of the zeta potential adjusting agents and the comparative compounds are shown below.

Copolymer 1 of a sulfonic acid (salt) group-containing monomer and acrylic acid (salt) (sodium salt, weight average molecular weight of 10,000, manufactured by Toagosei Co., Ltd., product number: Aron (registered trademark) A-6012), Copolymer 2 of a sulfonic acid (salt) group-containing monomer and acrylic acid (salt) (sodium salt, weight average molecular weight of 3,000, manufactured by Nippon Shokubai Co., Ltd., product number: AQUALIC (registered trademark) L GL-246), Polyvinylphosphonic acid (30% by mass aqueous solution, weight average molecular weight of 40,000, manufactured by FUJIFILM Wako Pure Chemical Corporation, product number: PVphos acid, 30%), Sulfonic acid group-containing polyvinyl alcohol (weight average molecular weight of 30,000, manufactured by Mitsubishi Chemical Corporation, product number: GOHSENX (registered trademark) CKS-50), Polyacrylic acid (weight average molecular weight of 3,000, manufactured by Toagosei Co., Ltd., product number: Aron (registered trademark) AC10SL), Polyvinyl alcohol (weight average molecular weight of 10,000, manufactured by Japan VAM & POVAL Co., Ltd., product number: JMR-10HH), Polyvinylpyrrolidone (weight average molecular weight of 40,000, manufactured by Tokyo Chemical Industry Co., Ltd., product number: PVP K30).

The weight average molecular weight of each of the zeta potential adjusting agents and the comparative compounds is a value measured by gel permeation chromatography (GPC) using polyethylene glycol as a standard substance.

The compositions of the obtained compositions for surface treatment are shown in Table 1 below.

[Viscosity of 20% by Mass Aqueous Solutions of Zeta Potential Adjusting Agent and Comparative Compound]

A zeta potential adjusting agent or a comparative compound was mixed with water (deionized water) to obtain an aqueous solution in which the concentration of the zeta potential adjusting agent or the comparative compound based on the total mass of the aqueous solution was 20% by mass. The viscosity (mPa·s) at a water temperature of 25° C. of the obtained aqueous solution was measured using a kinematic viscometer (manufactured by Suzuki Scientific Instruments, Inc., product number: manual viscosity tube No. 50). Results thereof are shown in Table 1.

Examples 1 to 20 and Comparative Examples 1 to 24

In order to evaluate the performance of compositions for surface treatment A1 to A5 and B1 to B6 obtained, an object to be polished was subjected to a CMP step and then the polished object to be polished obtained through the CMP step was subjected to a rinse polishing step, as follows. The rinse polishing step is carried out using the above compositions for surface treatment A1 to A5 and B1 to B6.

[CMP Step]

First, an object to be polished was subjected to a CMP step. The object to be polished was a SiN substrate described later, and the following two polishing compositions were provided.

[Polishing Compositions]

Polishing composition C1 (polishing composition using $CeO_2$ abrasive grains as abrasive grains)

Colloidal ceria (HC30 manufactured by Solvay S. A.) (average primary particle size: 30 nm, average secondary particle size: 60 nm, 30% by mass aqueous dispersion): 1% by mass Ammonium polyacrylate (manufactured by Toagosei Co., Ltd., Aron (registered trademark) A-30SL, Mw: 6,000, 40% by mass aqueous solution): 0.6% by mass 30% by mass maleic acid aqueous solution (manufactured by Kanto Chemical Co., Inc.): 0.2% by mass Water: Balance (Adjusted to pH 4).

Polishing composition C2 (polishing composition using anion-modified $SiO_2$ abrasive grains as abrasive grains)

Anion-modified colloidal silica (sulfonic acid-modified colloidal silica prepared by the method described in "Sulfonic acid-functionalized silica through quantitative oxidation of thiol groups", Chem. Commun. 246-247 (2003), average primary particle size: 35 nm, average secondary particle size: 70 nm): 2% by mass 30% by mass maleic acid aqueous solution (manufactured by Kanto Chemical Co., Inc.): 0.002% by mass Ammonium sulfate (manufactured by Kanto Chemical Co., Inc.): 0.25% by mass Water: Balance (Adjusted to pH 3).

[CMP Step]

A SiN substrate, which is a semiconductor substrate, as an object to be polished was polished using the above polishing composition C1 or C2 under the following conditions. The Shore A hardness of each of the following polishing pads is a value measured based on a type A durometer according to JIS K 6253-3:2012. As the SiN substrate, a 300 mm wafer (manufactured by Advantec Co., Ltd., product number: (CVD-)LP-SiN 2500A) was used;

—Polishing Apparatus and Polishing Conditions—

Polishing Apparatus: FREX300E Manufactured by Ebara Corporation

Polishing pad: One of the following was used

Foamed polyurethane pad H800-Type 1 (Shore A hardness: 89.4°) manufactured by Fujibo Holdings, Inc.

Foamed polyurethane pad H800-CZM (Shore A hardness: 78.9°) manufactured by Fujibo Holdings, Inc.

Foamed polyurethane pad X400-CZM (Shore A hardness: 76.3°) manufactured by Fujibo Holdings, Inc.

Conditioner (Dresser): Nylon brush (manufactured by 3M)

Polishing pressure: 2.0 psi (1 psi=6894.76 Pa)

Platen rotation speed: 80 rpm

Head rotation speed: 80 rpm

Supply of polishing composition: continuous pouring without recycle

Supply rate of polishing composition: 200 mL/min

Polishing time: 30 seconds.

[Rinse Polishing Treatment Step]

After polishing the surface of the SiN substrate in the above CMP step, the polished SiN substrate was dismounted from the platen as a polished object to be polished. Subsequently, within the same polishing apparatus, the polished SiN substrate was mounted on another platen, and each of compositions for surface treatment A1 to A5 and B1 to B6 prepared above was used to subject the surface of the polished SiN substrate to a rinse polishing treatment under the following conditions;

—Rinse Polishing Apparatus and Rinse Polishing Conditions—
   Polishing pressure: 1.0 psi
   Platen rotation speed: 60 rpm
   Head rotation speed: 60 rpm
   Supply of composition for surface treatment: continuous pouring without recycle
   Supply rate of composition for surface treatment: 300 mL/min
   Polishing time: 60 seconds.

After the rinse polishing treatment, the surface of the substrate was brush-cleaned using deionized water for 60 seconds to obtain a rinse-polished polished SiN substrate.

<Evaluations>

The following items were measured and evaluated for each polished SiN substrate after the above rinse polishing step. Evaluation results are shown in Tables 2 to 5 below.

Table 2 below shows "evaluation results (Examples 1 to 5 and Comparative Examples 1 to 6) of each of compositions for surface treatment A1 to A5 and B1 to B6 for the polished SiN substrate" obtained by polishing the SiN substrate (object to be polished) using polishing composition C1 and using H800-Type 1 as the polishing pad in the polishing step.

Table 3 below shows "evaluation results (Examples 6 to 10 and Comparative Examples 7 to 12) of each of compositions for surface treatment A1 to A5 and B1 to B6 for the polished SiN substrate" obtained by polishing the SiN substrate (object to be polished) using polishing composition C1 and using H800-CZM as the polishing pad in the polishing step.

Table 4 below shows "evaluation results (Examples 11 to 15 and Comparative Examples 13 to 18) of each of compositions for surface treatment A1 to A5 and B1 to B6 for the polished SiN substrate" obtained by polishing the SiN substrate (object to be polished) using polishing composition C1 and using X400-CZM as the polishing pad in the polishing step.

Table 5 below shows "evaluation results (Examples 16 to 20 and Comparative Examples 19 to 24) of each of compositions for surface treatment A1 to A5 and B1 to B6 for the polished SiN substrate" obtained by polishing the SiN substrate (object to be polished) using polishing composition C2 and using H800-Type 1 as the polishing pad in the polishing step.

[Evaluation of Total Number of Residues]

For the total number of residues, the number of residues on the surface of the polished SiN substrate after the rinse polishing treatment was evaluated using an optical inspection machine Surfscan (registered trademark) SP5 manufactured by KLA-Tencor Corporation. Specifically, the number of residues having a diameter of more than 50 μm was counted in the remaining portion after excluding the portion having a width of 5 mm inward from the outer peripheral end portion of one side of the polished SiN substrate (the portion from a width of 0 mm to a width of 5 mm with the outer peripheral end portion as 0 mm). A smaller number of residues is more preferable. Results thereof are shown in Tables 2 to 5 below. If the total number of residues exceeds 200,000, the number cannot be detected, and thus ">200000" is indicated in Tables 2 to 5 below.

[Evaluation of Number of Abrasive Grain Residues and Number of Polyurethane Residues]

For the polished SiN substrate after the above rinse polishing treatment, the number of abrasive grain residues and the number of polyurethane residues were measured by SEM observation using Review SEM RS6000 manufactured by Hitachi High-Tech Corporation. First, 100 residues present in the remaining portion after excluding the portion having a width of 5 mm inward from the outer peripheral end portion of one side of the polished SiN substrate were sampled by SEM observation. Next, among the 100 residues sampled, the types of the residues (abrasive grain or polyurethane) were determined by visual SEM observation, and the number of abrasive grain residues ($CeO_2$ residues or anion-modified $SiO_2$ residues) and the number of polyurethane residues were checked to calculate the proportion (%) of the abrasive grain residues and the proportion (%) of the polyurethane residues, respectively, in the residues. Then, the product of the total number (residues) of residues having a diameter of more than 50 μm measured by the above evaluation of the total number of residues and the proportion (%) of the abrasive grain residues in the residues calculated by SEM observation was calculated as the number (residues) of abrasive grain residues. In addition, the product of the total number (residues) of residues having a diameter of more than 50 μm measured by the above evaluation of the total number of residues and the proportion (%) of the polyurethane residues in the residues calculated by SEM observation was calculated as the number (residues) of polyurethane residues.

In Table 2 to Table 5, the "Number of abrasive grain residues" is the number of residues of inorganic oxide abrasive grains (residues of $CeO_2$ abrasive grains or residues of anion-modified $SiO_2$ abrasive grains), and the "Number of polyurethane residues" is the number of residues derived from the polishing pad. When the total number of residues exceeded 200,000, the number of abrasive grain residues and the number of the polyurethane residues in the residues were unable to be calculated. It is considered that the great majority of the residues are abrasive grain residues, and thus in Table 2 to Table 5, when the total number of residues exceeds 200,000, the number of abrasive grain residues is indicated as ">200000," and the number of polyurethane residues is indicated as "-."

[Measurement of Zeta Potential of Inorganic Oxide Abrasive Grains]

The zeta potential of the inorganic oxide abrasive grains is a value measured by Zetasizer Nano ZSP manufactured by Spectris Co., Ltd. (Malvern Division). The zeta potential of the $CeO_2$ abrasive grains being rinse-polished using the composition for surface treatment and the zeta potential of the anion-modified $SiO_2$ abrasive grains being rinse-polished using the composition for surface treatment were values measured by the following model experiments, respectively. These values are shown in Table 1 below.

($CeO_2$ Abrasive Grains)

A $CeO_2$ particle dispersion (HC30 manufactured by Solvay S. A., 30% by mass aqueous dispersion of colloidal ceria having average primary particle size: 30 nm and average secondary particle size: 60 nm) was added to the composition for surface treatment prepared above to prepare a measurement liquid having a $CeO_2$ particle concentration of 0.02% by mass (the content (concentration) of the $CeO_2$ particle in the measurement liquid was 0.02% by mass based on the total mass of the measurement liquid). A measurement-dedicated cell of the above apparatus (Zetasizer Nano ZSP) was filled with the obtained measurement liquid, and the zeta potential of the $CeO_2$ abrasive grains was measured.

(Anion-Modified $SiO_2$ Abrasive Grains)

An anion-modified $SiO_2$ particle dispersion (19.5% by mass aqueous dispersion of anion-modified colloidal silica (sulfonic acid-modified colloidal silica prepared by the method described in "Sulfonic acid-functionalized silica through quantitative oxidation of thiol groups", Chem. Commun. 246-247 (2003), average primary particle size: 35 nm, average secondary particle size: 70 nm)) was added to the composition for surface treatment prepared above to prepare a measurement liquid having an anion-modified $SiO_2$ particle concentration of 0.02% by mass (the content (concentration) of the anion-modified $SiO_2$ particle in the measurement liquid was 0.02% by mass based on the total mass of the measurement liquid). A measurement-dedicated cell of the above apparatus (Zetasizer Nano ZSP) was filled with the obtained measurement liquid, and the zeta potential of the anion-modified $SiO_2$ abrasive grains was measured.

[Measurement of Zeta Potentials of Polished SiN Substrate and Polyurethane]

The zeta potential of the polished SiN substrate and the zeta potential of polyurethane are each a value measured by a solid zeta potential measuring instrument SurPASS 3 manufactured by Anton Paar Japan K. K. The zeta potential of the surface of the polished SiN substrate being rinse-polished using the composition for surface treatment and the zeta potential of polyurethane being rinse-polished using the composition for surface treatment were values measured by the following model experiments, respectively. These values are shown in Table 1 below.

For the zeta potential of polyurethane, a polyurethane pad (foamed polyurethane pad H800-Type 1 manufactured by Fujibo Holdings, Inc.) cut into a square of 60 mm per side was used as an object to be measured.

For the zeta potential of the surface of the polished SiN substrate, a SiN substrate (300 mm wafer, manufactured by Advantec Co., Ltd., product number: (CVD-)LP-SiN 2500A) cut into a square of 60 mm per side was used as an object to be measured.

These objects to be measured were each placed on a zeta potential meter. Next, the composition for surface treatment prepared above was passed through the objects to be measured, and the zeta potentials of these objects to be measured were each measured.

TABLE 1

Compositions and properties of compositions for surface treatment, and zeta potentials in compositions for surface treatment

| Composition for surface treatment | | | | | | | Zeta potentials in surface treatment composition [mV] | | | |
|---|---|---|---|---|---|---|---|---|---|---|
| | Zeta potential adjusting agent or comparative compound | | | | | | Inorganic oxide abrasive grains | | Polishing pad Poly-urethane | Polished SiN substrate SiN |
| Composition for surface treatment | Type | Weight average molecular weight | Viscosity of 20% aqueous solution [mPa·s] | Concentration [g/kg] | pH adjusting agent | pH | $CeO_2$ | Anion-modified $SiO_2$ | | |
| A1 | Copolymer 1 of sulfonic acid (salt) group-containing monomer and acrylic acid (salt) | 10000 | 10.1 | 1.0 | Nitric acid | 3 | −40.2 | −46.0 | −45.7 | −46.5 |
| A2 | Polyvinylphosphonic acid | 40000 | 12.1 | 1.0 | Nitric acid | 3 | −53.6 | −43.0 | −40.1 | −50.5 |
| A3 | Sulfonic acid group-containing polyvinyl alcohol | 30000 | 10.9 | 1.0 | Nitric acid | 3 | 41.0 | −44.0 | −45.0 | 45.9 |
| A4 | Copolymer 1 of sulfonic acid (salt) group-containing monomer and acrylic acid (salt) | 10000 | 10.1 | 1.0 | Nitric acid | 2 | −36.0 | −40.0 | −41.0 | −51.0 |
| A5 | Copolymer 1 of sulfonic acid (salt) group-containing monomer and acrylic acid (salt) | 10000 | 10.1 | 1.0 | Nitric acid | 4 | −30.0 | −43.0 | −10.0 | −38.0 |
| B1 | NA | | | 0 | Nitric acid | 3 | 36.8 | −49.0 | 8.2 | 45.8 |
| B2 | Polyacrylic acid | 3000 | 10.9 | 1.0 | Nitric acid | 3 | 37.3 | −42.0 | 6.6 | 36.9 |
| B3 | Copolymer 2 of sulfonic acid (salt) group-containing monomer and acrylic acid (salt) | 3000 | 2.5 | 1.0 | Nitric acid | 3 | 15.5 | −41.0 | 0.9 | 32.1 |
| B4 | Polyvinyl alcohol | 10000 | 9.4 | 1.0 | Nitric acid | 3 | −0.2 | −40.0 | −6.8 | −0.2 |
| B5 | Polyvinylpyrrolidone | 40000 | 11.6 | 1.0 | Nitric acid | 3 | 3.3 | −40.0 | −2.4 | 2.5 |
| B6 | Copolymer 1 of sulfonic acid (salt) group-containing monomer and acrylic acid (salt) | 10000 | 10.1 | 1.0 | Nitric acid | 5 | 0.2 | −41.0 | 0.2 | 0.1 |

TABLE 2

Evaluation results of compositions for surface treatment
(polishing composition C1/polishing pad H800-Type 1)

| CMP step conditions; Polishing composition C1 Polishing pad H800-Type 1 | | Evaluation results | | |
|---|---|---|---|---|
| | | Total number of residues [residues] | Number of abrasive grain residues (CeO$_2$) [residues] | Number of polyurethane residues (Polishing pad) [residues] |
| Example 1 | Composition for surface treatment A1 | 200 | 100 | 100 |
| Example 2 | Composition for surface treatment A2 | 400 | 200 | 200 |
| Example 3 | Composition for surface treatment A3 | 350 | 175 | 175 |
| Example 4 | Composition for surface treatment A4 | 250 | 125 | 125 |
| Example 5 | Composition for surface treatment A5 | 960 | 300 | 660 |
| Comparative Example 1 | Composition for surface treatment B1 | >200000 | >200000 | — |
| Comparative Example 2 | Composition for surface treatment B2 | >200000 | >200000 | — |
| Comparative Example 3 | Composition for surface treatment B3 | >200000 | >200000 | — |
| Comparative Example 4 | Composition for surface treatment B4 | >200000 | >200000 | — |
| Comparative Example 5 | Composition for surface treatment B5 | >200000 | >200000 | — |
| Comparative Example 6 | Composition for surface treatment B6 | >200000 | >200000 | — |

TABLE 3

Evaluation results of compositions for surface treatment
(polishing composition C1/polishing pad H800-CZM)

| CMP step conditions; Polishing composition C1 Polishing pad H800-CZM | | Evaluation results | | |
|---|---|---|---|---|
| | | Total number of residues [residues] | Number of abrasive grain residues (CeO$_2$) [residues] | Number of polyurethane residues (Polishing pad) [residues] |
| Example 6 | Composition for surface treatment A1 | 280 | 140 | 140 |
| Example 7 | Composition for surface treatment A2 | 380 | 190 | 190 |
| Example 8 | Composition for surface treatment A3 | 360 | 180 | 180 |
| Example 9 | Composition for surface treatment A4 | 380 | 190 | 190 |
| Example 10 | Composition for surface treatment A5 | 700 | 200 | 500 |
| Comparative Example 7 | Composition for surface treatment B1 | >200000 | >200000 | — |
| Comparative Example 8 | Composition for surface treatment B2 | >200000 | >200000 | — |
| Comparative Example 9 | Composition for surface treatment B3 | >200000 | >200000 | — |
| Comparative Example 10 | Composition for surface treatment B4 | >200000 | >200000 | — |
| Comparative Example 11 | Composition for surface treatment B5 | >200000 | >200000 | — |
| Comparative Example 12 | Composition for surface treatment B6 | >200000 | >200000 | — |

TABLE 4

Evaluation results of compositions for surface treatment
(polishing composition C1/polishing padX400-CZM)

| CMP step conditions; Polishing composition C1 Polishing pad X400-CZM | | Evaluation results | | |
|---|---|---|---|---|
| | | Total number of residues [residues] | Number of abrasive grain residues (CeO$_2$) [residues] | Number of polyurethane residues (Polishing pad) [residues] |
| Example 11 | Composition for surface treatment A1 | 500 | 250 | 250 |
| Example 12 | Composition for surface treatment A2 | 400 | 200 | 200 |
| Example 13 | Composition for surface treatment A3 | 400 | 200 | 200 |
| Example 14 | Composition for surface treatment A4 | 400 | 200 | 200 |
| Example 15 | Composition for surface treatment A5 | 900 | 300 | 600 |
| Comparative Example 13 | Composition for surface treatment B1 | >200000 | >200000 | — |
| Comparative Example 14 | Composition for surface treatment B2 | >200000 | >200000 | — |
| Comparative Example 15 | Composition for surface treatment B3 | >200000 | >200000 | — |
| Comparative Example 16 | Composition for surface treatment B4 | >200000 | >200000 | — |
| Comparative Example 17 | Composition for surface treatment B5 | >200000 | >200000 | — |
| Comparative Example 18 | Composition for surface treatment B6 | >200000 | >200000 | — |

TABLE 5

Evaluation results of compositions for surface treatment
(polishing composition C2/polishing pad H800-Type 1)

| CMP step conditions; Polishing composition C2 Polishing pad H800-Type 1 | | Evaluation results | | |
|---|---|---|---|---|
| | | Total number of residues [residues] | Number of abrasive grain residues (Anion-modified $SiO_2$) [residues] | Number of polyurethane residues (Polishing pad) [residues] |
| Example 16 | Composition for surface treatment A1 | 300 | 150 | 150 |
| Example 17 | Composition for surface treatment A2 | 500 | 250 | 250 |
| Example 18 | Composition for surface treatment A3 | 400 | 200 | 200 |
| Example 19 | Composition for surface treatment A4 | 400 | 200 | 200 |
| Example 20 | Composition for surface treatment A5 | 800 | 400 | 400 |
| Comparative Example 19 | Composition for surface treatment B1 | >200000 | >200000 | — |
| Comparative Example 20 | Composition for surface treatment B2 | >200000 | >200000 | — |
| Comparative Example 21 | Composition for surface treatment B3 | >200000 | >200000 | — |
| Comparative Example 22 | Composition for surface treatment B4 | >200000 | >200000 | — |
| Comparative Example 23 | Composition for surface treatment B5 | >200000 | >200000 | — |
| Comparative Example 24 | Composition for surface treatment B6 | >200000 | >200000 | — |

As shown in Table 2 to Table 4, it was found that in Examples 1 to 15, after the SiN substrate was polished using polishing composition C1 (that is, the polishing composition using $CeO_2$ abrasive grains as abrasive grains), the rinse polishing of the polished SiN substrate using each of compositions for surface treatment A1 to A5 remarkably reduced the residues (total number of residues) on the polished SiN substrate.

In addition, as shown in Table 5, it was found that in Examples 16 to 20, even when the SiN substrate was polished using polishing composition C2 (that is, the polishing composition using anion-modified $SiO_2$ abrasive grains as abrasive grains), the rinse polishing of the polished SiN substrate using each of compositions for surface treatment A1 to A5 remarkably reduced the residues (total number of residues) on the polished SiN substrate.

From these, it is found that when an object to be polished containing silicon nitride is polished using a polishing composition containing cerium oxide abrasive grains or anion-modified silicon oxide abrasive grains as abrasive grains, the residues (abrasive grains, polishing pad) adhering to the polished object to be polished can be sufficiently removed by surface-treating the polished object to be polished using the composition for surface treatment of the present invention.

When the composition for surface treatment is stored or preserved for a long period of time, the composition for surface treatment preferably further contains an antifungal agent (antiseptic agent). The antifungal agent (antiseptic agent) is thought to have little or no influence on the above results, and thus it is considered that the composition for surface treatment containing the antifungal agent (antiseptic agent) also has the same results as above.

The present application is based on Japanese Patent Application No. 2021-129176 filed on Aug. 5, 2021 and Japanese Patent Application No. 2022-078426 filed on May 11, 2022, the disclosures of which are incorporated herein by reference in their entirety.

The invention claimed is:

1. A surface treatment method for reducing a residue comprising inorganic oxide abrasive grains on a surface of a polished object to be polished comprising silicon nitride using a composition for surface treatment, wherein
the composition for surface treatment comprises a zeta potential adjusting agent having a negatively charged functional group and having a viscosity of an aqueous solution having a concentration of 20% by mass at 25° C. of 10 mPa·s or more and a dispersing medium, and
the surface treatment method comprises controlling a zeta potential of the silicon nitride and a zeta potential of the inorganic oxide abrasive grains each to −30 mV or less using the composition for surface treatment.

2. The surface treatment method according to claim 1, wherein the inorganic oxide abrasive grains comprise cerium oxide abrasive grains, and a zeta potential of the cerium oxide abrasive grains is controlled to −30 mV or less using the composition for surface treatment.

3. The surface treatment method according to claim 1, wherein the residue further comprises polyurethane, and the surface treatment method further comprises controlling a zeta potential of the polyurethane to −10 mV or less using the composition for surface treatment.

4. The surface treatment method according to claim 1, wherein the zeta potential adjusting agent is a polymer having an anionic group and having a weight average molecular weight of 1,000 or more.

5. The surface treatment method according to claim 4, wherein the polymer having an anionic group has at least one functional group selected from the group consisting of a sulfonic acid (salt) group, a sulfuric acid (salt) group, a phosphonic acid (salt) group, a phosphoric acid (salt) group, and a carboxylic acid (salt) group.

6. The surface treatment method according to claim 1, wherein the composition for surface treatment further comprises a pH adjusting agent.

7. The surface treatment method according to claim 1, wherein a pH value of the composition for surface treatment is 2 or more and less than 5.

8. The surface treatment method according to claim 1, wherein the surface treatment method is a rinse polishing treatment method or a cleaning treatment method.

* * * * *